United States Patent [19]
Hazani

[11] Patent Number: 5,304,505
[45] Date of Patent: Apr. 19, 1994

[54] PROCESS FOR EEPROM CELL STRUCTURE AND ARCHITECTURE WITH INCREASED CAPACITANCE AND WITH PROGRAMMING AND ERASE TERMINALS SHARED BETWEEN SEVERAL CELLS

[76] Inventor: Emanuel Hazani, 1210 Sesame Dr., Sunnyvale, Calif. 94087

[21] Appl. No.: 813,374

[22] Filed: Dec. 23, 1991

Related U.S. Application Data

[60] Division of Ser. No. 377,311, Jul. 10, 1989, Pat. No. 5,099,297, and a continuation-in-part of Ser. No. 613,235, Nov. 14, 1990, Pat. No. 5,162,247, which is a division of Ser. No. 326,924, Mar. 22, 1989, Pat. No. 5,040,036, Ser. No. 377,311, Jul. 10, 1989, Pat. No. 5,099,297, which is a continuation-in-part of Ser. No. 327,663, Mar. 22, 1989, Pat. No. 5,047,814.

[51] Int. Cl.$^5$ .......................................... H01L 21/70
[52] U.S. Cl. ...................................... 437/52; 437/43; 437/48; 437/195; 437/97
[58] Field of Search ................ 437/43, 48, 52, 977; 357/23.5

[56] References Cited

U.S. PATENT DOCUMENTS

| | | | |
|---|---|---|---|
| 3,996,657 | 12/1976 | Simko et al. | 437/43 |
| 4,267,632 | 5/1981 | Shappir | 437/52 |
| 4,404,577 | 9/1983 | Cranford | 357/23 |
| 4,720,323 | 1/1988 | Sato | 437/43 |
| 4,727,043 | 2/1988 | Matsumoto | 437/43 |
| 4,757,360 | 7/1988 | Faraone | 357/23.5 |
| 4,774,202 | 9/1988 | Pam et al. | 437/43 |
| 4,795,719 | 1/1989 | Eitan | 437/48 |
| 4,804,637 | 2/1989 | Somayling et al. | 437/43 |
| 4,810,666 | 3/1989 | Jaji | 437/43 |
| 4,833,096 | 5/1989 | Huang et al. | 437/52 |
| 4,849,369 | 7/1989 | Jeuch et al. | 437/43 |
| 4,851,365 | 7/1989 | Jeuch | 437/48 |
| 4,868,619 | 9/1989 | Mulcherjee et al. | 357/23.5 |
| 4,892,840 | 1/1990 | Esquivel et al. | 437/48 |
| 5,095,344 | 3/1992 | Harari | 357/23.5 |
| 5,098,855 | 3/1992 | Komori et al. | 437/44 |

FOREIGN PATENT DOCUMENTS 0167472  8/1985  Japan .

OTHER PUBLICATIONS

Yoshikawa et al., "An Asymetrically Lightly Doped Source (ALDS) Cell For Virtual Ground High Density EPROMs" IEDM 88 pp. 432≧435.
B. Kwong and J. Caywood, NOVRAM Reliability Report, XICOR Inc., Data-Book-1985.

*Primary Examiner*—Tom Thomas

[57] ABSTRACT

An EEPROM memory cell structure and architecture that achieve very high speed programming with low power. The cell has four control terminals. The structure utilizes programming and erasure by electron tunneling only. The structure allows programming by hot electrons from the substrate and erasure by electron tunneling between polysilicon layers. A process for forming the structure results in final feature size for the floating gate and the space between floating gates in a memory array to be significantly smaller than achievable by photolithography equipment's resolution capability.

34 Claims, 14 Drawing Sheets

PROCESS FOR EEPROM CELL STRUCTURE AND ARCHITECTURE WITH INCREASED CAPACITANCE AND WITH PROGRAMMING AND ERASE TERMINALS SHARED BETWEEN SEVERAL CELLS

CROSS-REFERENCE OF RELATED APPLICATIONS

This application is a division of application Ser. No. 07/377,311, filed Jul. 10, 1989,now U.S. Pat. No. 4,099,297 which is a continuation-in-part of application Ser. No. 07/327,663, filed Mar. 22, 1989 which issued as U.S. Pat. No. 5,047,814. This application is also a continuation in part of application Ser. No. 07/613,235, filed Nov. 14, 1990, now U.S. Pat. No. 5,162,247, which is a division of Ser. No. 326,924, filed Mar. 22, 1989, now U.S. Pat. No. 5,040,036.

The disclosure of all above mentioned applications, and also the application of U.S. Pat. No. 4,763,299, filed Oct. 15, 1985 and issued Aug. 9, 1988 to the same applicant of this application. All said applications are expressly incorporated herein by reference.

BACKGROUND OF THE INVENTION

The present invention relates generally to nonvolatile semiconductor memory and, more particularly, relates to an improved electrically erasable programmable read only memory (EEPROM).

DESCRIPTION OF THE RELEVANT ART

The invention of U.S. Pat. No. 4,845,538 uses electron tunneling between two polysilicon layers to perform programming and erasure. U.S. Pat. No. 4,763,299 issued to Emanuel Hazani (the '299 patent) describes an invention that uses hot electron from the substrate to program and polysilicon to polysilicon electron tunneling to erase.

Although the EEPROM cell and process described in application Ser. No. 331,934, now U.S. Pat. No. 5,040,036, which is a continuation in part U.S. Pat. No. 4,845,538, results in a small cell area it requires higher on-chip programming voltage. Also as typical to EEPROMs that program using electron tunneling the cell programming time of such an embodiment is about two milliseconds (2 mS), which is relatively long. So usage for this invention are in applications where low cost is the most important factor. The following are some examples: computer program memory, computer operating systems memory, and smart identification cards.

The invention of the '299 patent programs by using hot electrons from the substrate. It has a very high programming efficiency due to the use of two control gates to couple the programming voltage to the floating gate. The programming time of a cell of this embodiment is much shorter than that of a tunneling program mechanism, in the range of one micro second (1 uS). This programming efficiency also reduces the programming drain-source current to about one micro Ampere (1 uA), which is much lower in comparison to other UVEPROM and EEPROM cells that program by using hot electrons from the substrate.

A description of an implementation of an embodiment of the '299 patent was disclosed in an article by R. Kazerounian et al. entitled "A 5 volt High Density Poly-Poly Erase Flash EPROM Cell", published in International Electron Device Meeting's Technical Digest, Dec. 11-14, 1988.

The short programming time of the cell of '299 patent together with the low programming current becomes extremely advantageous in applications such as IC-Card Camera in which the digitally processed image is rapidly stored in a semiconductor memory. It is estimated that the IC-Card Camera will take over the multibillion dollars photographic market place in the near future. In this camera the EEPROM chip or Static RAM chips act as the equivalent of the chemical film of the dark chamber camera. However SRAM chips, using at least four transistors in each memory cell, are much more expensive to make than an EEPROM chip using the one transistor cell of the '299 patent. On the other hand existing EEPROM chips are too slow to program or require too much power to program, which loads the battery operated camera, or have very large cell size which makes them too expensive for use in this application.

It is therefor desired to reduce the programming/erasure voltage of EEPROMs, while also reduce the cell size of EEPROMs, in order to reduce production cost. Further more it is desirable to accomplish this reduction in size using conventional photolithography equipment. The use of conventional equipment such as photo-light based step-and-repeat cameras, also known as steppers, and projection aligners contribute to low production cost, since these equipment are widely used and many people are skilled in operating these equipment. Also, by using conventional photolithography equipment one uses conventional chemicals, such that photoresists which are readily available today from many vendors. Alternatives to these approach, such as the use of x-ray lithography equipment is expensive, not fully understood and not available for purchase in high quantity.

SUMMARY OF THE INVENTION

This invention describes another EEPROM cell that uses the polysilicon to polysilicon tunneling concept to erase and also to program. The process to fabricate the cell and array is also an improved process to build embodiments of the '299 patent, which result in smaller cell size thus reduce production cost.

One aspect of the invention discloses an operation as an EEPROM with a memory cell size smaller than the cell disclosed in U.S. Pat. No. 4,845,538, however it requires an additional polysilicon programming-control line, which is shared between two read control word-lines. This programming-control line requires some additional decoding circuitry that is not needed with the cell of U.S. Pat. No. 4,845,538. The addition of the programming-control line makes the implementation of EEPROM memories using substrate materials other than silicon easier at this time. This is particularly relevant for example for such substrates, as Germanium or Gallium-Arsenide, since the isolation technology between diffusion lines is not as developed as for silicon technology, which will make EEPROM cells of U.S. Pat. No. 4,845,538, made of these substrates, much larger in size.

Another embodiment of the invention is a process that provide a small cell of the '299 patent, which will be shown here together with one embodiment of the architecture of claim 2 of the '299 patent in which at least four EEPROM cells share a diffusion terminal and each EEPROM cell's floating gate has a programming section and an erase section disposed about the bit-line axis. The processing method can apply to other architectures of the '299 patent.

Another embodiment of the present split-gate invention pertaining to UVEPROM (hot electron programming) will improve on the previous art by providing a smaller cell size if the same minimum critical-dimension of photolithography equipment are used in fabrication of the cell. Also it provides better control of the channel length dimension of the floating gate, by using chemical definition, as oppose to a definition by photolithography equipment which depends on the precision of the machinery's resolution and misalignment, in addition to the photoresist resolution. The embodiment provides a better control over the coupling overlap-area between the drain diffusion and the floating gate in order to minimize this coupling.

BRIEF DESCRIPTION OF THE DRAWINGS

FIG. 7a is a cross section along line 101—101' of FIG. 7b.

FIG. 8 is a section cut along line 201—201' of FIG. 8b. *The photoresist is not shown in FIG. 8B.*

FIG. 9 is a cross section cut along line 301—301, of FIG. 10a before the removal of the photoresist that protects the floating gate along the even numbered word-lines from the etchant.

FIGS. 16a and 16b illustrate the use of CVD oxide spacer in the formation of N-implant in one side of the floating gate in order to create an asymmetry in programming of a non-split-gate EEPROM embodiment.

DETAILED DESCRIPTION OF THE INVENTION

Figure 1:
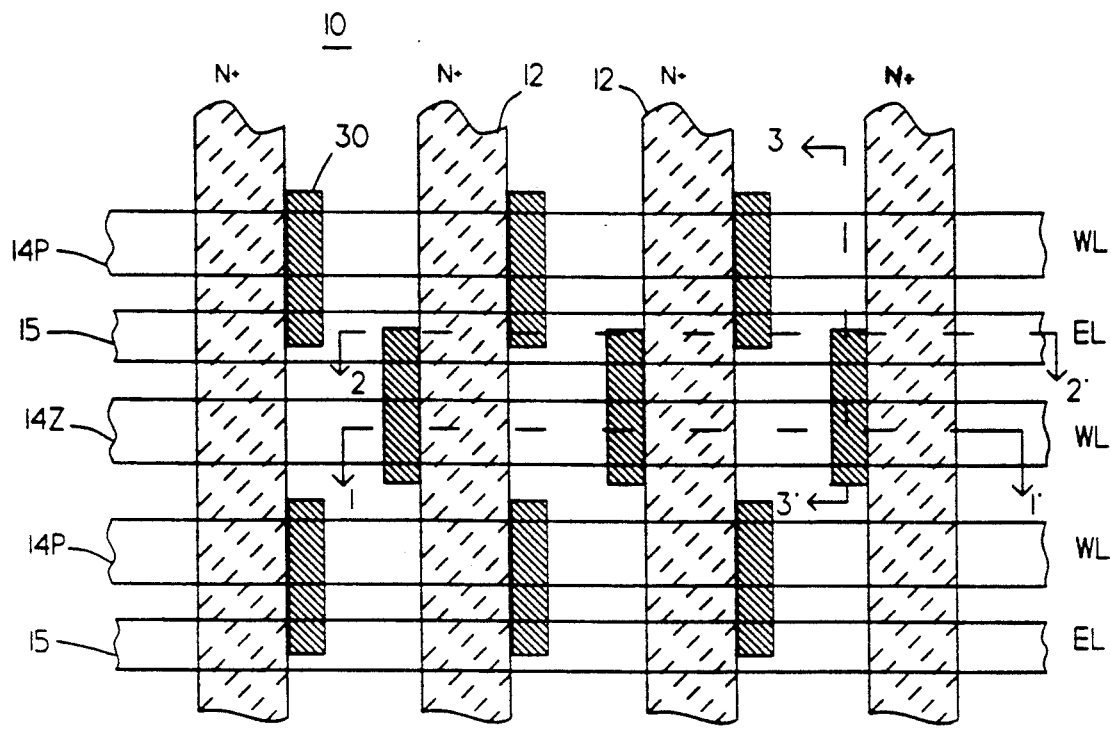
FIG. 1 is a plan view of a portion of a memory chip containing an array of the first embodiment of the present invention.

FIG. 1 depicts the overall layout of the array of EEPROM cells. Referring now to FIG. 1, the array is laid out on the major surface 10 of a P doped monocrystalline silicon substrate. A first set of equispaced, vertical N+ regions form the source/drain lines of the array. These source/drain lines are crossed by a first set of horizontal polysilicon read word lines 14. The source/drain lines 12 are also crossed by a second set of horizontal polysilicon program/erase word lines 15. A third set of floating gate poly layers 30 each include a first region disposed below an associated word line 14.

The read word lines 14 and the program/erase word lines 15 and floating gates 30 are formed from separate poly layers that are deposited over the substrate and then selectively etched.

A basic memory cell is defined at the intersection of each source/drain line 12 with the two word lines; the read word line 14 and the program/erase word line 15. The structure of a of several embodiments of the cell will now be described with reference to FIGS. 2 to 21.

Figure 2:
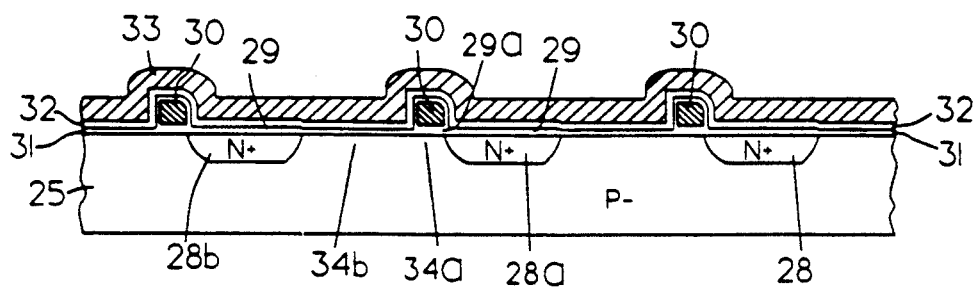
FIG. 2 is a cross section view of the memory cells of FIG. 1 along the channel regions, line 1—1' of FIG. 1.

FIG. 2 illustrates a cross-sectional view of a memory cell of the first embodiment taken along cut 1—1' of FIG. 1. The cell includes a p— substrate 25. Two n+ diffused regions 28a and 28b are spaced apart by a channel 34. An oxide layer 29 covers regions 28a and 28b. The drain area 34a of the channel is filled with an oxide layer 29a and a polycrystalline silicon layer 30. The source area 34b of the channel is covered by an oxide layer 31 and polycrystalline silicon layer 33. Oxide layer 29 is greater in thickness over the n+ diffused regions 28a and 28b than the thickness of oxide layer 29a over the drain area 34a of the channel. Oxide layer isolate the polycrystalline region 30 and the polycrystalline layer 33 which covers the upper surface of oxide layer 31 over the source area 34b of the channel and also covers the upper surface of oxide layer 31 over the polycrystalline region 30.

The channel region of the cell is formed between the n+ regions 28a and 28b. The n+ regions 28a and 28b form the drain and the source of the transistor respectively. A floating gate is formed by the polycrystalline silicon region 30 over the drain area 34a of the channel. The control gate is formed by the polycrystalline silicon 33 over the source area of the channel 34b and over the floating gate 30.

Figure 3:
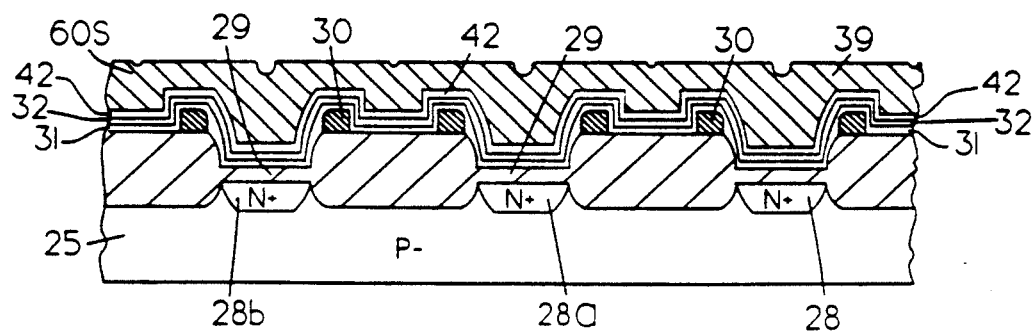
FIG. 3 is a cross section view of the memory cells of FIG. 1 along the isolation regions, line 2—2' of FIG. 1.

FIG. 3 illustrates a cross-sectional view of the array of memory cells along the program/erase word line, cut 2—2' of FIG. 1. Field oxide regions 41 form isolation regions to separate the bit-line diffusion 28a and 28b. Floating gates 30 are separated from each other and from program/erase word line 60s by interpoly oxide isolation layers 31, 32 and 42.

Figure 4A:
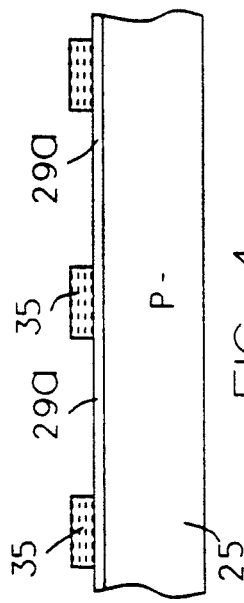
FIG. 4a is a cross section illustrating the stage of manufacturing of the device of FIG. 2 after the definition of the isolation region. Here nitride is deposited and etched.

Referring to FIGS. 4a it illustrates a cross sectional view of the wafer for a fabrication steps, which comes after the definition of the isolation regions. Field isolation regions are defined by a photolithography mask step. These defined region are then etched into the wafer and the field oxide 41 is then thermally grown over these regions in a manner well known in the art. In FIG. 4a a thin oxide layer of 250 Angstroms is thermally grown at 800 degrees Celsius to form gate oxide 29a of floating gate 30.

Thereafter a nitride film 35 is deposited to form a thickness of about 3500 Angstroms and patterned by isotropic etching, by plasma for example, to form equispaced nitride lines in parallel to the bit-line axis. The result is illustrated as a top view in FIG. 4b.

Figure 5:
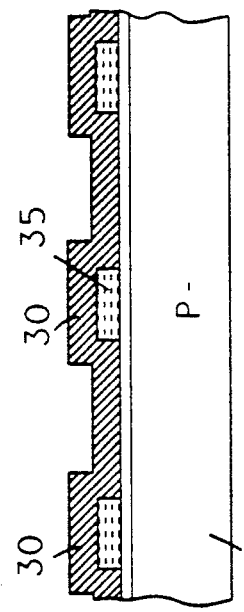
FIG. 5 illustrates the deposition of the first polysilicon layer.

Polysilicon layer 30 is then deposited as illustrated in FIG. 5 for example at 560 deg. C. by low pressure vapor deposition (LPCVD) to a desired thickness, for example 5000 Angstrom, which is half a micrometer (0.5 um). The polysilicon layer 30 is then doped with phosphorous by passing POCL3 through a chamber at 950 degree Celsius for about 15 minutes.

Figure 6A:
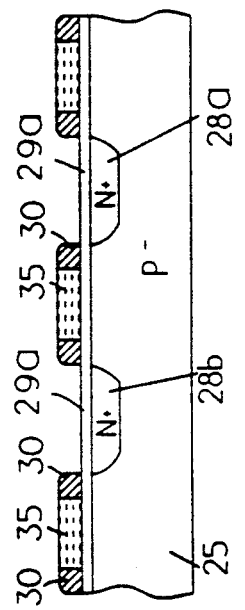
FIGS. 6a and 6b illustrate a cross section and top view, which result after the first anisotropic etching of the first polysilicon and after ion implantation of the bit-line diffusion.
Figure 4B:
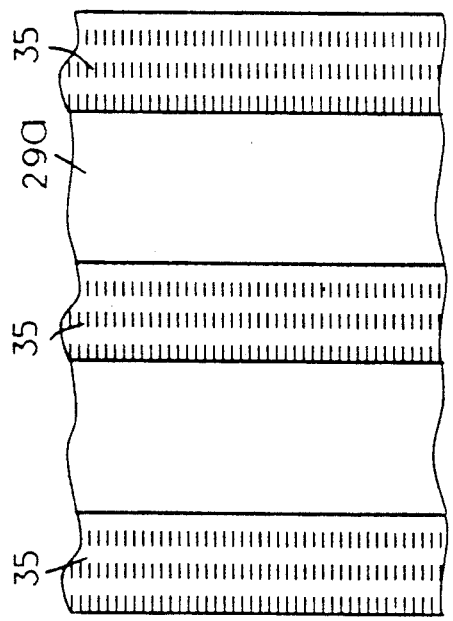
FIG. 4b is a top view of the array of FIG. 1 illustrating the same initial stage of manufacturing of the device of FIG. 2.
Figure 6B:
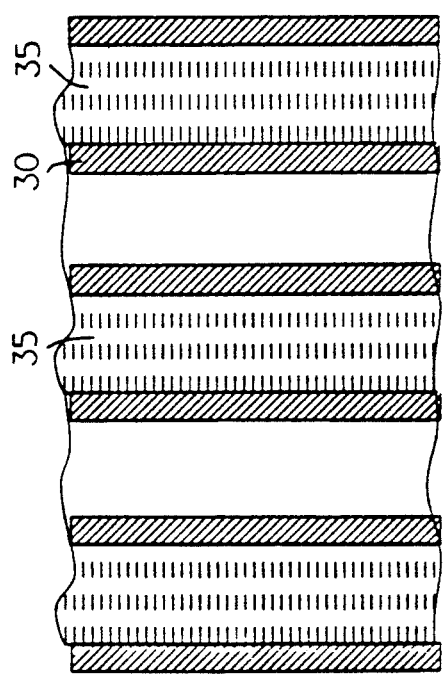

Anisotropic etching of poly-1 is performed next using reactive ion etching to a point where poly-1 covers only portions of the oxide 29a as shown in FIGS. 6a and 6b.

The bit line diffusion areas 28a and 28b are formed next as illustrated in FIG. 6a, when an n+ Arsenic ions 1.0E16/cm2 are implanted at 60 KeV and annealed at 850 degrees Celsius for 12 minutes. Next the nitride film 35 is removed by chemical stripping.

Figure 7A:
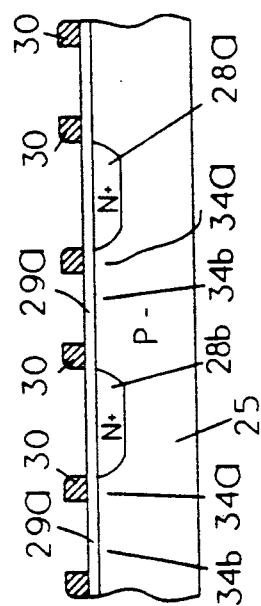
FIGS. 7a and 7b illustrate a cross section and top view, which result after implanting N+ to form the bit-line diffusion and after the removal of the nitride by chemical stripping.
Figure 7B:
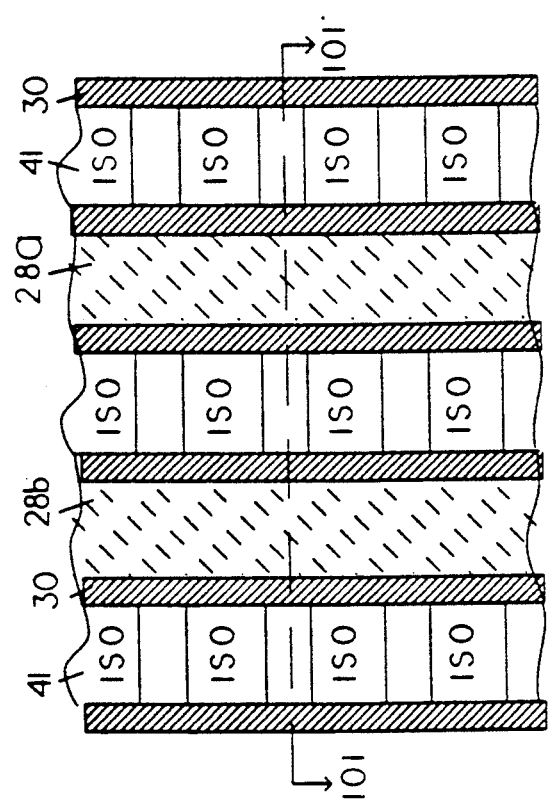

FIGS. 7a and 7b illustrate the result of the processing steps to this point in the process. FIG. 7a is a section cut along line 101—101' of FIG. 7b. FIG. 7b shows the long lines of polysilicon 30, which will eventually be cut to form the floating gate's electrical width. FIG. 7a shows the width of the polysilicon strings 30, which will form the floating gate's electrical length.

In one example the floating gate poly-1 30 covers less than a third of the channel of the memory cell, so that the source area 34b is as wide as two thirds of the channel. The height of the floating gate poly-1 30 at this step of processing is about 3500 Angstrom, which was the thickness of the nitride. The geometrical width of the polysilicon line 30, which parallels the electrical channel length of the floating gate is half a micrometer, which is its thickness during deposition.

Due to the fact that the floating gate's geometrical dimensions are controlled by a precise chemical process, the dimensions can be controlled within 5% accuracy. This accuracy can not be achieved by photolithography equipment at this time. For example a typical top of the line stepper is specified at 0.8 um minimum line width, with 0.1 um mask resolution and 0.15 um misalignment. In addition the photoresist's resolutions of 0.1 um is added to the calculation, such that it is clear that even if a 0.5 um line was specified by the stepper, it would have been printed within +0.2 um or −0.2 um resolution (±ask ±resist), which is only 40% accuracy if the floating gate's length is 0.5 um, and will adversely affect production yields.

Figure 10A:
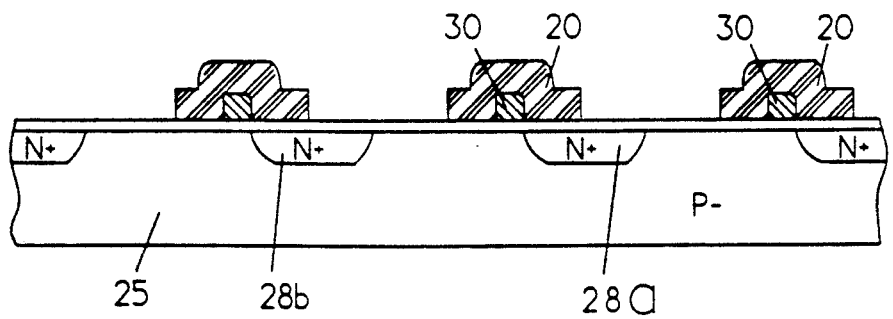
FIG. 10a and 10b illustrate a cut along 301—301' and a top view of the array of FIG. 1 after the formation of the floating gates, but before the formation of the word line or the interpoly dielectric.
Figure 10B:
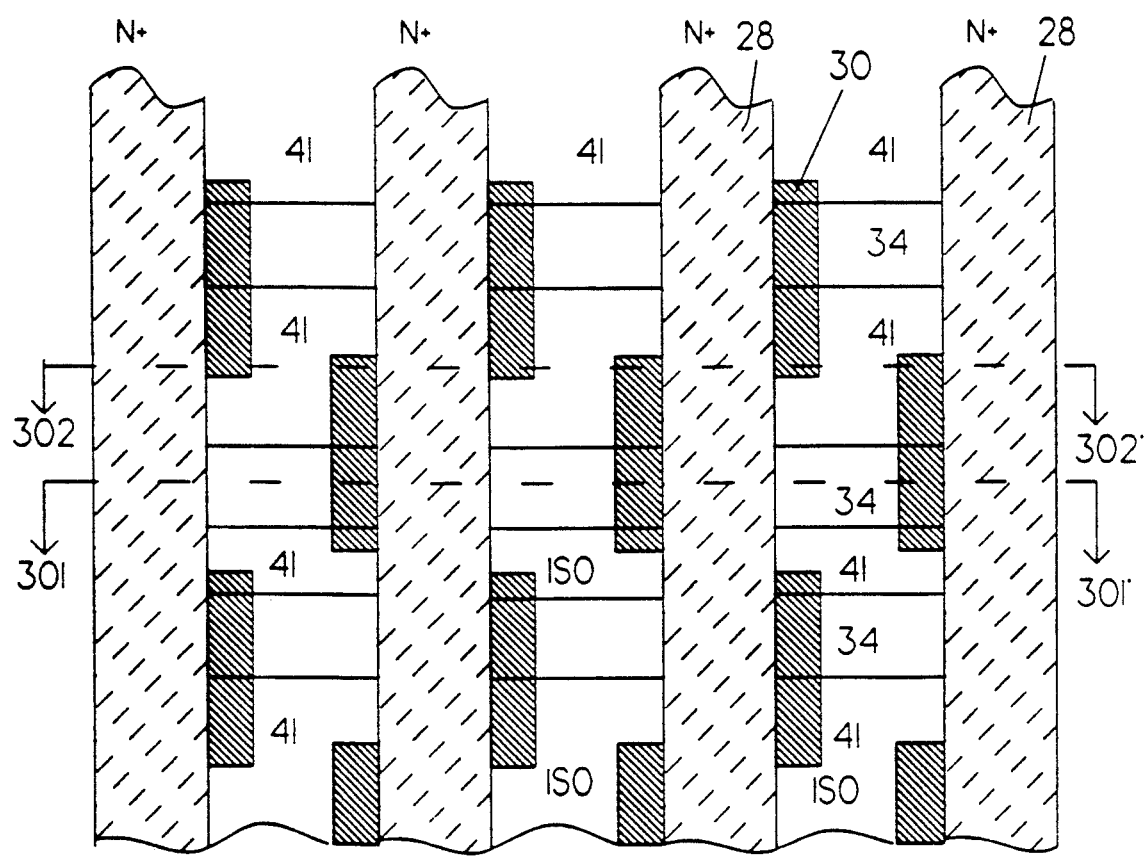

The next step in the process is etching of the polysilicon lines 30 to define the longer geometrical side of the floating gate, which parallels the bit-line axis, and also parallels the electrical width of the memory cell's channel. This is done by covering the polysilicon lines 30 with photoresist layer 20 over areas where it will function as a floating gate, as illustrated in FIG. 10a. The photoresist mask 20 is aligned to the middle of the isolation mask 41, which is between the polysilicon lines 30. After etching layer 30 to form the floating gates, the photoresist is removed. The result of this one photoresist masking step and etching is shown in FIG. 10b.

The anisotropic etching of the polysilicon 30 by plasma or preferably by RIE, provide another opportunity to reduce the memory cell size by narrowing the width of bit line diffusion 28, which is measured between polysilicon lines 30. This can be done due to the ability of the anisotropic etching by plasma or RIE to create a space for diffusion 28, as narrow as 0.3 micrometers in today's technology, between the two polysilicon lines 30. This could not be achieved if today's photolithography equipment would be used, as described for example in prior art U.S. Pat. No. 4,639,893 assigned to Waferscale Integration Inc., which discloses a process to manufacture a split gate UVEPROM.

By having the capability to narrow the width of bit line 28, one can design the mask of nitride layer 35 (and layer 41), so as to bring the parallel nitride stripes 35 much closer to each other, thus reduce memory cell size. The practical limit of the reduction will be the ability to use resist mask 20 to define the geometrical length of floating gates 30 in one masking step. This is because resist mask 20, which is used to etch polysilicon line 30, will limit the spacing between poly lines 30 along the geometrical width to the photolithography specification.

However, to take maximum advantage of the present invention, further reduction of the cell and array size is achieved by substituting the above process step of one mask definition by photoresist 20 of floating gate 30 with defining the polysilicon lines 30 using two photoresist masking steps as follows: After the chemical stripping of the nitride 35, and arriving at the result of FIG. 7a, a photoresist 27 is used to protect the polysilicon 30 areas, which will form the floating gates 30P under odd numbered read word lines 14P. The photoresist 27 does not cover the polysilicon line 30 disposed over source areas 34b of the even numbered word lines 14Z, so that this portion of layer 30 will be etched away. The photoresist 27 also totally covers the polysilicon 30 line which will be used to form the floating gates 30Z of the even numbered read word lines, in order to prevent etching.

Figure 8A:
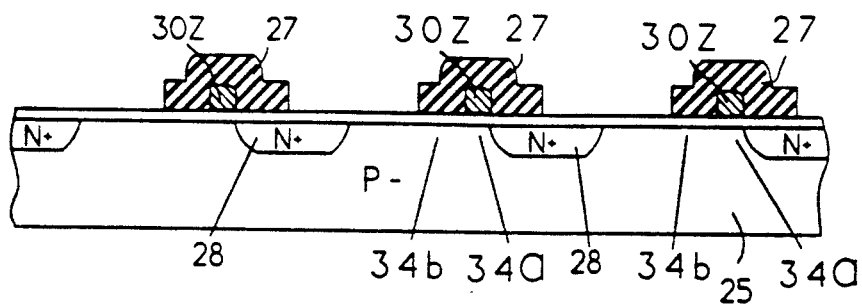
FIGS. 8a and 8b illustrate a cross section and top view, which result after process steps involving the definition of floating gates along odd numbered word-lines.
Figure 8B:
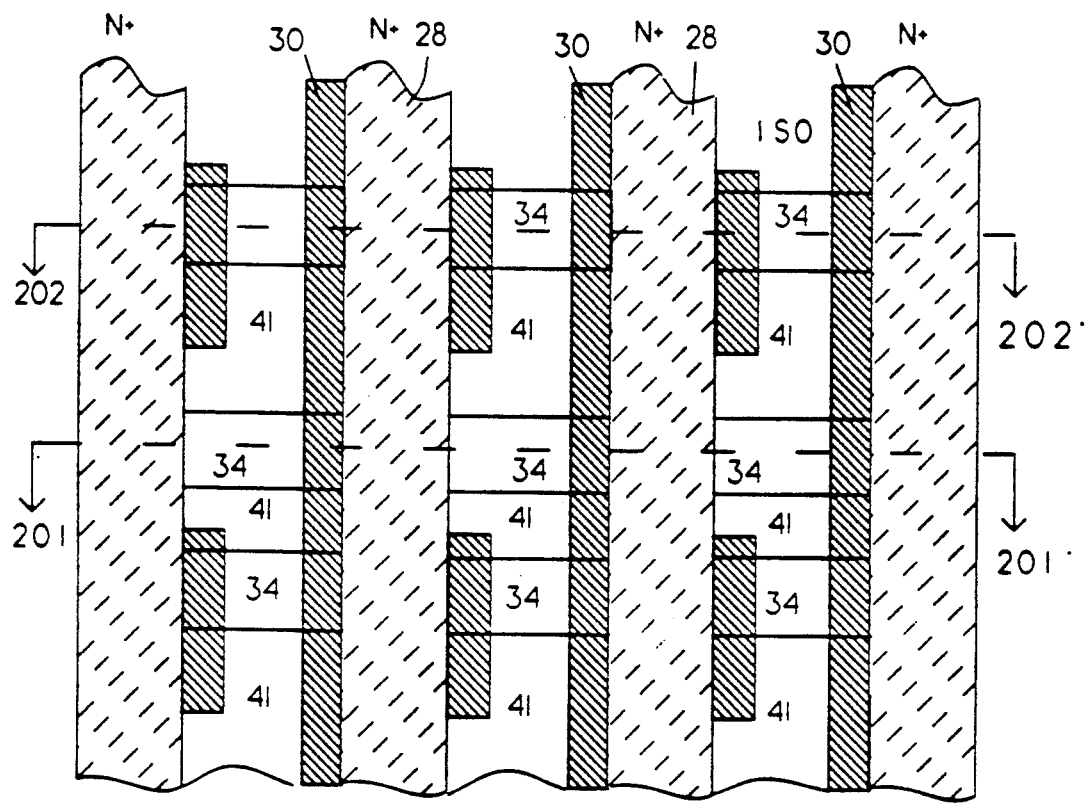

The result of etching to create the floating gate 30P under the odd numbered read word lines 14P is shown in FIG. 8b.

FIG. 8b is a top view of the memory array 10 after the definition of floating gates 30 of the odd numbered read word lines 14P. FIG. 8a is section cut along line 201—201' of FIG. 8b. Line 201—201' runs along the channels 34 and over polysilicon lines 30 of the even numbered read word lines 14Z.

Once the floating gates 30 of the odd numbered read word lines 14P are defined and the photoresist 27 is removed, the next processing step is to define the floating gates 30 under even numbered read word lines 14Z.

Figure 9:
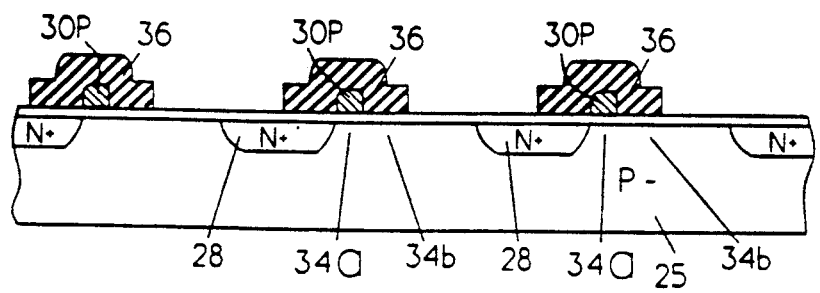
FIG. 9 illustrates a step in the formation of the floating gates along even numbered word-lines.

FIG. 9 is a section cut along line 202—202' of FIG. 8b. FIG. 9 shows the photoresist 36 that protects the floating gates 30P of the odd numbered word lines 14P, while the polysilicon 30 is etched from the source area 34b of the odd numbered read word lines 14P. The resist layer 36 also protect portion of polysilicon line 30 over the drain areas 34a of the channels 34 of the even numbered read word lines 14Z, and over portion of the isolation field oxide 41. The mask of resist layer 36 is aligned to the middle of the isolation mask 41, as was the case for resist mask 27.

Using two separate photoresist masks 27 and 36, permits further narrowing of the distance between centers of adjacent nitride lines 35 (and mask 41). This is accomplished by over exposing the positive photoresist mask that defines the nitride lines 35 (and that of mask 41) of FIG. 4a and 4b, to a point where the nitride lines 35 are etched to produce final line-width narrower than the minimum specification of the photolithography equipment. When the final line width of nitride 35 and isolation layer 41 are planned in advance to take advantage of the over-exposed masks, the photoresist masks of layers 35 and 41, will be designed to draw a significantly smaller size memory cell that will include the narrow diffusion bit-line width 28 created by the anisotropic etching procedure described above.

FIG. 10b illustrates a top view of the processed wafer of the memory array 10 of FIG. 1 after the floating gates 30 were defined.

Figure 11A:
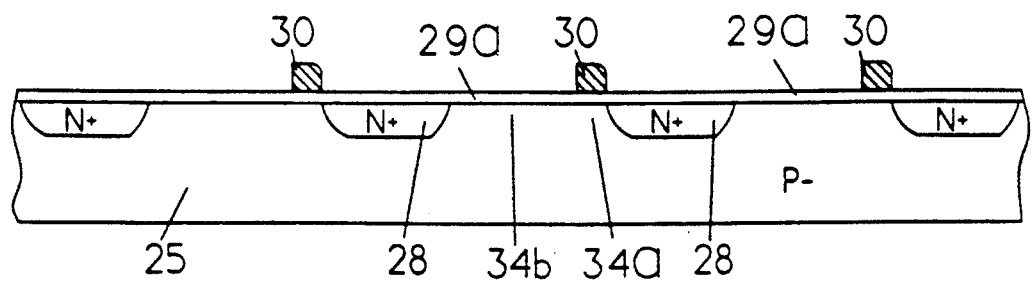
FIGS. 11a and 11b illustrate section cuts along lines 301—301' and 302—302' of FIG. 10 respectively.
Figure 11B:
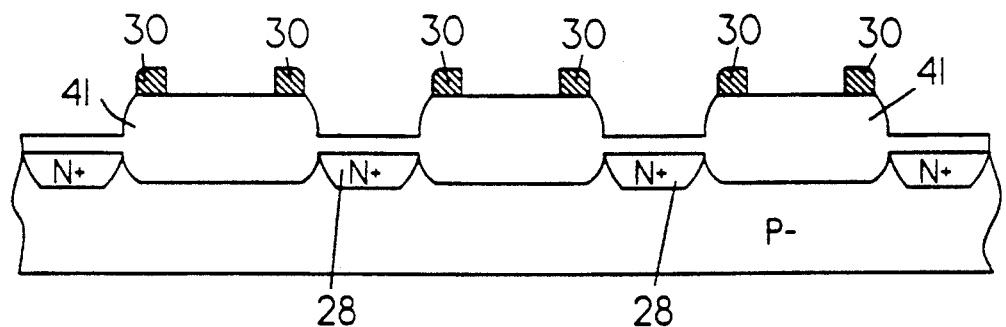

FIGS. 11a and 11b illustrate section cuts along lines 301—301' and 302—302' of FIG. 10 respectively.

In the next processing step the 250 Angstroms thin oxide 29a is removed from all area of the wafer excluding channel region 34a under floating gates 30, where it functions as gate oxide. Floating gate polysilicon 30 protects oxide 29a underneath it from the etchant that etches oxide much faster than polysilicon. This is done in preparation for growing the interpoly oxide dielectric between floating gate poly 30 and either of the word lines' polysilicon. This procedure keeps the oxide thickness over channel region 34b close to the oxide thickens over channel region 34a.

After the removal of oxide 29a, the floating gate 30's surface is oxidized in an atmosphere of oxygen and steam at 800 degrees Celsius such that mainly the top surface of layer 30 at the interface with this thermal oxide (not shown) is textured with asperities. After a period of time of oxidation which gives a desired asperity size, the oxide is removed, and the floating gate 30 is covered with asperities, the source area 34b is not covered with oxide.

A new thermal oxide 31 is then grown over floating gate 30, source area 34b and the whole array, in a mixture of oxygen and steam at 800 degrees Celsius to a thickness of about 150 Angstroms.

Another layer of TEOS (tetraethylorthosilane) based LPCVD oxide layer 32 is deposited to a thickness of about 300 Angstrom over thermal oxide 31, as shown in FIG. 2. This combination of thermal oxide and deposited oxide dielectric was shown to increase the oxide breakdown voltage and reduce electron trapping in the oxide, which is advantageous in EEPROM memory chips. Although, a combination of thermal oxide and deposited oxide was chosen in this embodiment, thermal oxide alone or deposited oxide alone will be sufficient to function as the interpoly dielectric.

After oxide layer 32 was deposited, its top surface topography will follow the shape of the textured top surface of the floating gate 30, however in a much more moderate undulations due to the oxide deposition process.

The thickness of the oxides on poly-1 layer 30 is 450 Angstrom, so is the thickness of the oxides on top of source area 34b. The oxide on the bit line regions 28 is thicker, about 600 Angstroms, due to the use of differential oxidation process. The oxide thickness on bit-line diffusion regions 28 is maximized in order to reduce the capacitance between the bit-line diffusion 28 and the word lines 14 and the word lines 15. This is done in order to reduce the capacitance load on the memory cell, thus reduce the read-cycle time.

The following stages of the manufacturing process involve the formation of the polysilicon control gates, namely the read word line 14 and the program/erase word line 15. The process differ slightly for the various embodiment of the present invention.

Figure 12:
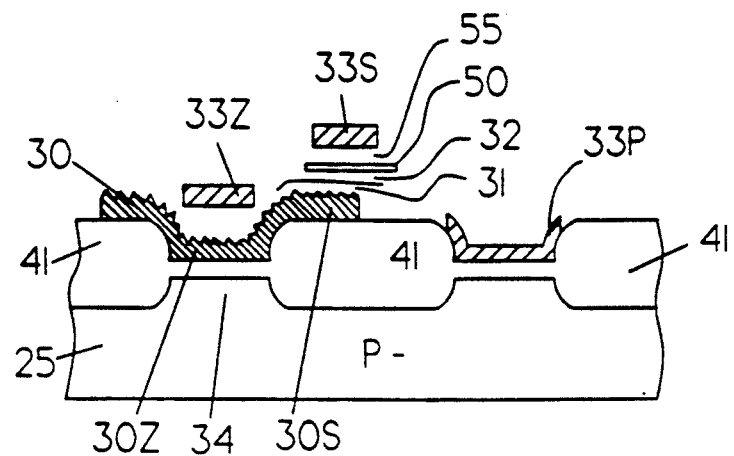
FIG. 12 illustrates a section cut along lines 3—3' of FIG. 1 as applicable to the first embodiment of the invention, which uses poly to poly electron tunneling to program.

FIG. 12 illustrates a section cut along line 3—3' of FIG. 1, as it relates to the first embodiment of the present invention.

The first embodiment uses a second polysilicon layer 33 for all word lines. In FIG. 12 the read word line is numbered 33z and the program/erase word line is numbered 33s. A special mask may be used to define a nitride layer 50 which is deposited prior to the deposition of polysilicon 33. This is done in order to increase the dielectric constant of the insulation between the steering region 30s of the floating gate 30 and the yet to be formed steering program/erase word line 33s, thus reduce the programming voltage of this embodiment as will be explained later in the section about the electrical operation of this embodiment. The nitride layer 50 also reduces the chance of electron tunneling from steering region 30s of the floating gate 30 to program/erase word line 33s and vice versa, since together with the underlying silicon dioxide, it provides a higher electron tunneling threshold than that of silicon dioxide dielectric alone.

A thin oxide layer 55 of 100 Angstroms is grown to cover the nitride layer 50 and the entire array. This approach of isolating a floating gate from a control word line by using a sandwich of oxide-nitride oxide dielectric is well known in the art, and is commonly used in many UVEPROM memory chips, where the control word line is a read/program word line.

The nitride layer 50 is not necessary for proper operation of this embodiment, and the electron tunneling threshold between the steering section 30s of floating gate 30 and the steering program/erase word line 33s may be increased alternatively by increasing the thickness of interpolysilicon silicon dioxide 31.

At this stage the second polysilicon layer 33, illustrated in FIG. 12, is deposited on oxide layer 55 by LPCVD at 650 degrees Celsius to a thickness of about 4000 Angstroms and then doped with phosphorous by passing POCL3 through a chamber at 950 degree Celsius for about 15 minutes.

A single masking step is used to define a photoresist layer used to cover polysilicon layer 33. Thereafter polysilicon 33 is etched to define the word lines 14z, 14p and 15 in a single step.

The bottom side of the polysilicon layer 33, also called poly-2, will take the shape of the mild undulations on the top surface of LPCVD oxide layer 32, such that a convex asperity on top of poly-1 layer 30 will face a concave layer of polysilicon at the bottom side of poly-2 layer 33.

As is well known in the art the tunneling threshold voltage of electrons tunneling through oxide dielectric from convex polysilicon to concave polysilicon, also called forward tunneling threshold voltage VXF, is lower than the reverse tunneling threshold voltage VXR. The tunneling voltage of electrons tunneling through oxide dielectric from concave polysilicon to a convex polysilicon, also called reverse tunneling threshold voltage VXR is higher than the forward tunneling threshold voltage VXF.

This asymmetry of tunneling between two polysilicon layers is applied in the operation of the EEPROM memory cell embodiments of the invention.

In the first embodiment of the present invention, reverse tunneling from polysilicon 33z of read word line layer 14 to polysilicon region 30z of floating gate layer is used for programming the memory cell. Forward tunneling from region 30z of floating gate layer 30 to polysilicon layer 33z read word line is used for erasure of the memory cell.

The second embodiment of the present invention will now be described with reference to FIG. 13.

The electrical operation of the second embodiment is similar to that of the first embodiment and will be discussed later.

Figure 13A:
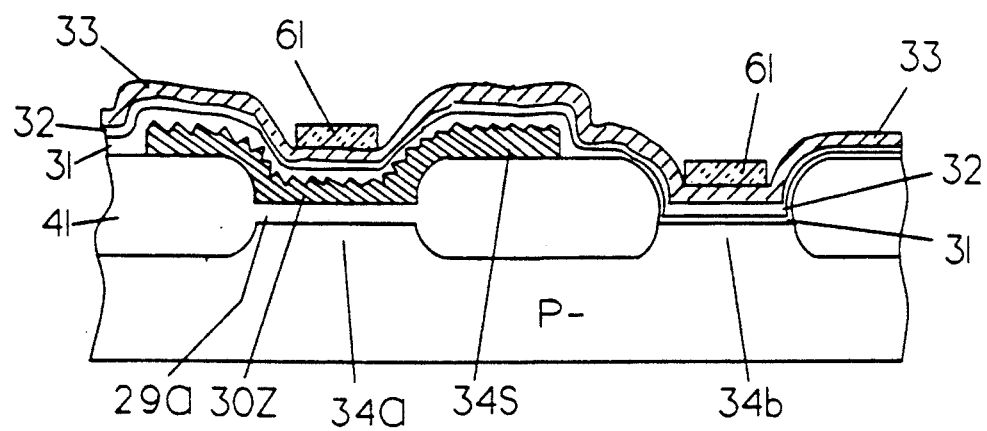
FIG. 13a through 13c illustrate schematic views of section cut along lines 3—3' of FIG. 1 as applicable to the second embodiment of the invention, which uses poly to poly electron tunneling to program.

The fabrication process steps of the second embodiment follow that of the first embodiment up to the point of depositing the polysilicon layer 33. After depositing polysilicon layer 33 on oxide 32 as pertain to this second embodiment, a single photoresist mask 61, shown in FIG. 13a, is used to define the read word lines 14z and 14p of FIG. 1.

While photoresist 61 protects polysilicon 33 over the regions 34, the rest of polysilicon 33 is etched away, and so are oxide layer 31 and 32 are etched away from all areas except from the interpoly area on top of the regions 30z of the floating gates 30.

Figure 13B:
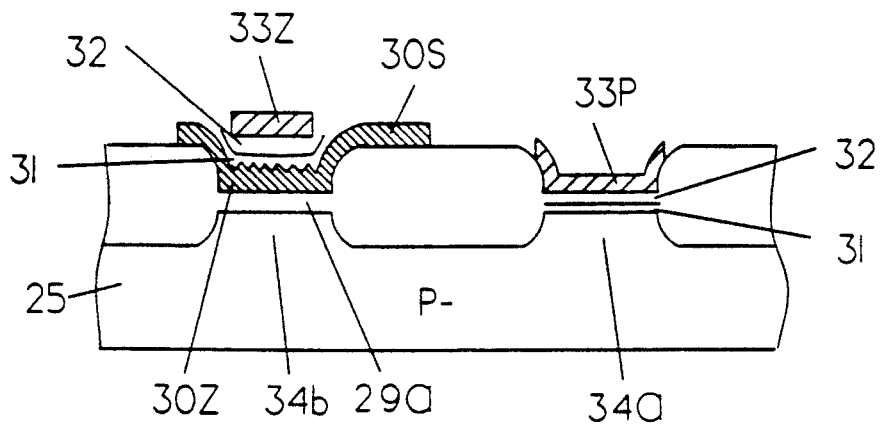

The result of the definition of the word lines 33z and 33p is shown in FIG. 13b. FIG. 13b also shows the result of using the word line 33z and 33p as shields providing umbrella to protect the asperities, bumps and rough edges over region 30z of the floating gate 30, while the asperities, bumps and rough edges are been destroyed over the steering region 30s of the floating gates 30.

Referring to FIG. 13b, after the steering region 30s was exposed it is implanted heavily by 1.0E18/cm2 phosphorous ions at 150 KeV for 30 minutes. This smoothing of the top of steering region 30s is done in order to increase electron tunneling threshold from region 30s to and from the yet to be formed steering program/erase word line 15 of FIG. 1, which will be denoted 60s in FIG. 13c.

Figure 13C:
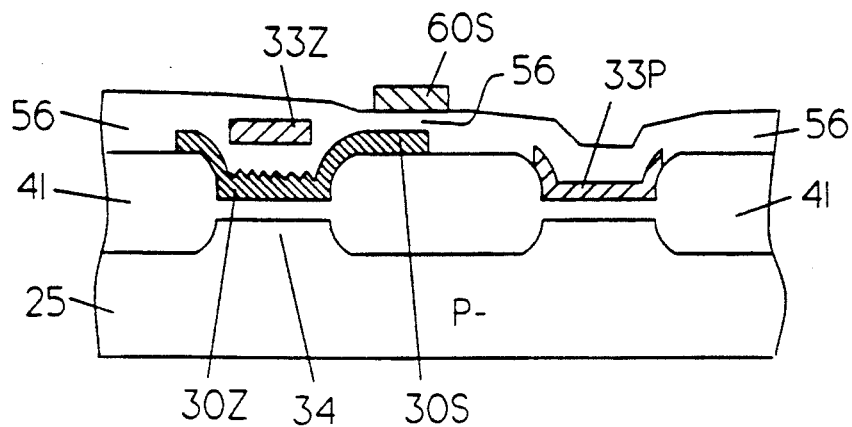

Referring now to FIG. 13c, thermal oxide layer 56 is grown over the entire memory array at 950 degrees Celsius to a thickness of about 450 Angstroms. Thereafter a third polysilicon layer 60s is deposited over oxide layer 56 by LPCVD at 650 degrees Celsius to a thickness of about 4000 Angstroms and then doped with phosphorous by passing POCL3 through the chamber at 950 degrees Celsius for about 15 minutes.

In the following step in the process a photoresist layer 63 (not shown) aligned to the second polysilicon layer 33, defines the steering program/erase word line 60s. Polysilicon 60s is etched away except from the area over the steering regions 30s of the floating gate polysilicon 30 where it serves as a word line 15 of FIG. 1.

The advantage of the second embodiment over the first embodiment is in the fact that the second embodiment enables the reduction of the space that is devoted to the program/erase word line 15 of FIG. 1 between adjacent read word lines 33z and 33p of FIG. 13c (14z and 14p of FIG. 1), thus reduce memory array size significantly. As can be seen in FIG. 12 of the first embodiment the space (pitch) between adjacent read word line 33z and 33p when separated by program/erase word line 33s (word line 15 in FIG. 1) is limited by the width of and spacing to program/erase word line 33s. This pitch is limited in fact by the photo lithography printing capability of the equipment used in manufacturing.

The second embodiment of FIG. 13c, significantly reduces the pitch of program/erase word line 15 of FIG. 1 (60s in FIG. 13c) due to the following reasons associated with the electrical performance requirements from the program/erase word line 15, which allow taking advantage of the processing steps described above and which lead to the results shown in FIG. 13c.

As will be said in the explanation about the electrical operation of this embodiment of the invention, the steering program/erase word line 60s does not carry any steady-state current and the voltage change $dV=7$ volts it carries during the selection for programming is applied slowly $dt=300$ nS, so the current induced by $i=C(dV/dt)$ is of relatively very low value in the range of 5 microampers, if for example the word lines 15's capacitance is about 0.15 pF for a word line 15 with 2048 steering regions 30s under it, which may represent a word line for a 4096 Kilo bits cells in an array arranged 2048 cells by 2048 cells.

This low current carrying word line 15 may be processed to be very narrow with little regard to the resultant high ohmic resistance, since the voltage drop across it is negligible. Also since the program/erase word line 15 of FIG. 1 (60s in FIG. 13c) does not act as a transistor's gate, no attention should be paid to such issues as the effect of processing on the channel length or width of a transistor.

The relative insensitivity of word line 15's electrical parameter to processing opens the opportunity to over-etch this third polysilicon 60s beyond the photolithography specifications of the particular manufacturing equipment, thus further reduce the pitch of program/erase word line 15.

The electrical operation of the first and second embodiments of the present invention will now be described.

It was disclosed in U.S. Pat. No. 4,845,538 and in accompanying application Ser. No. 331,934, now U.S. Pat. No. 5,040,036, that the cell may be programmed by holding the drain diffusion 28 at a high voltage Vpp while the control gate polysilicon 33 (read word line 14 of FIG. 1) is held at Vss ground potential. The source diffusion 28 may be held at Vss or at half Vpp (½*Vpp). This biasing condition ensures that the source area of the channel 34b is not inverted and that there is no current between drain and source. At this voltage conditions the drain voltage is coupled to the floating gate through the capacitance of the overlap area between floating gate 30 and drain diffusion 28a. The floating gate voltage increases to such a level which is higher than the unprogrammed threshold voltage of the cell, thus inverting the drain area of the channel 34a. Once the drain area 34a is inverted it carries the high voltage Vpp of the drain diffusion 28a. The capacitive coupling between the channel's drain area 34a and the floating gate 30 is about 10 times that of the capacitive coupling between the drain 28a and the floating gate 30.

The polysilicon 33s of FIG. 12 for the first embodiment and polysilicon 60s of FIG. 13c for the second embodiment (program/erase word line 15 of FIG. 1) assist in inverting the channel's drain area 34a by elevating the voltage of floating gate 30 during programming by coupling a high voltage Vpp to the steering region 30s of floating gate 30. By doing so the voltage of drain diffusion 28a does not need to be very high. A typical value of Vpp voltage for both the selected cells's drain diffusion 28a and for a selected cell's program/erase steering word line 15 is 14 volts. The capacitive coupling between the polysilicon program/erase word line 15 and the steering region 30s of the floating gate 30 is about 5 times that of the capacitive coupling between the drain diffusion 28a and region 30z of floating gate 30.

This sudden increase of Vpp coupling to the floating gate through the drain area 34a brings the floating gate to a voltage which causes reverse electron tunneling from the grounded control gate 33 to the floating gate 30, through the oxide layers 32 and 31. This transfer of electrons which are trapped in the floating gate programs the cell by changing its threshold.

The cell may be erased by holding the drain 28a, source 28b and the steering program/erase word line 15 (polysilicon 33s in FIG. 12 and polysilicon 60s in FIG. 13c) at Vss and taking the control gate 33 to high voltage Vpp. This causes forward electron tunneling from the floating gate 30's region 30z to the control gate polysilicon 33z (word line 14z or 14p in FIG. 1) through oxide layers 31 and 32, which brings the cell to its initial an unprogrammed threshold voltage.

Figure 14:
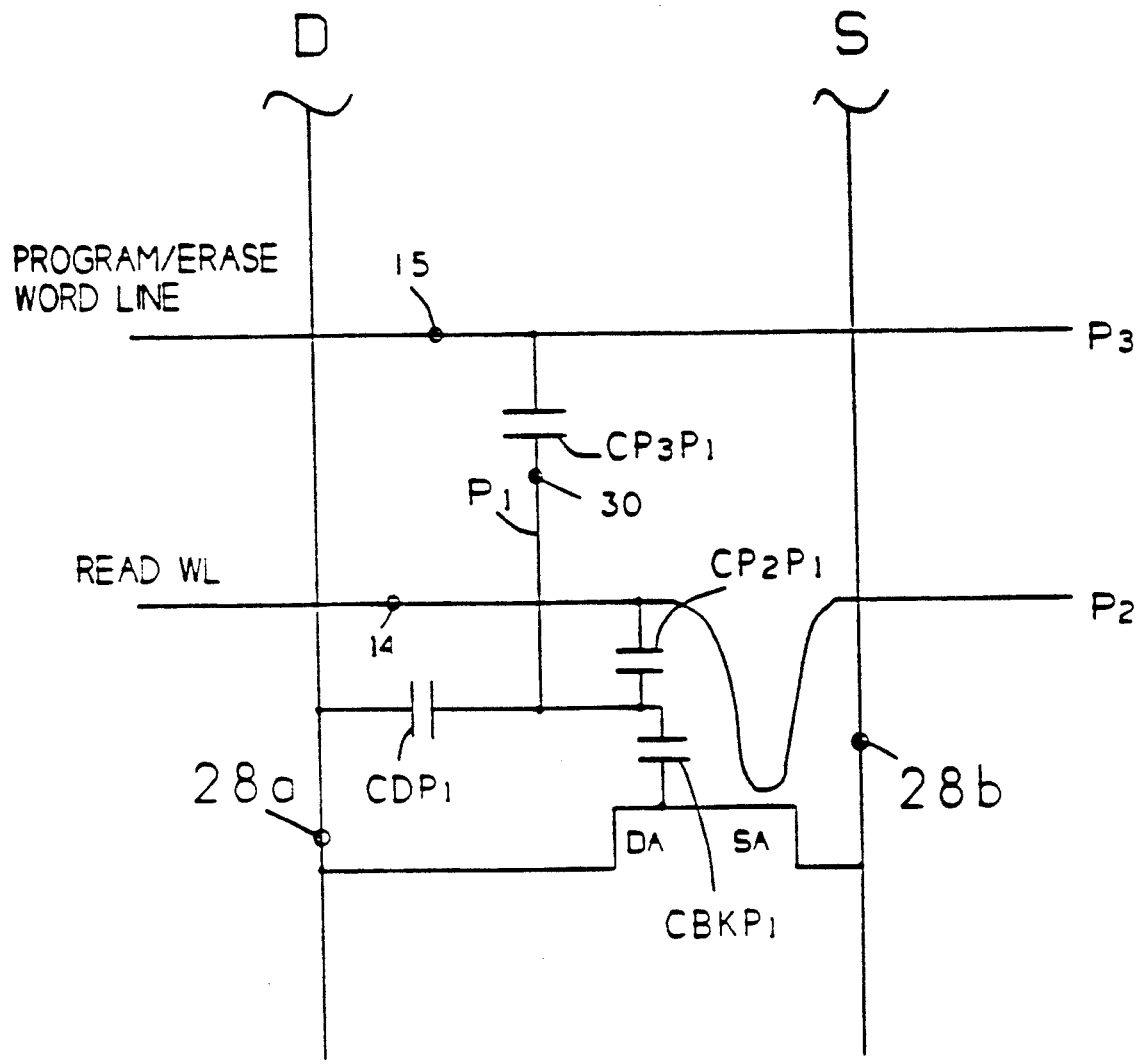
FIG. 14 illustrates section cut along lines 3—3' of FIG. 1 as applicable to the third embodiment of the invention, which uses hot electrons to program.

FIG. 14 is an electrical model illustrating the capacitive coupling of the floating gate 30 (also called P1) to the drain diffusion line 28a (CDP1) under one edge of region 30z, to the read word line (also called P2) 14 (CP2P1) over region 30z, to the program/erase word line (also called P3) 15 (CP3P1) over region 30s, and to the bulk semiconductor 34a (CBKP1) under region 30z.

The following Equation (1) expresses the floating gate 30 voltage (VP1) in terms of the above-described capacitances, the charge (QP1) of the floating gate 30, and the voltage levels on the read word line 14 (VP2), the program/erase word line 15 (VP3), the drain diffusion 28a (VD), and region 34a of the substrate 34a (VBK).

$$VP1 = \frac{(-QP1) + [VP2\ CP2P1 + VP3\ CP3P1 + VD\ CDP1 + VBK\ CBKP1]}{CP2P1 + CP3P1 + CDP1 + CBKP1} \quad \text{Eq. 1}$$

The program and erase be described for the first and second embodiments using the dielectrics and oxide thicknesses of the second embodiment that were described in reference to FIG. 13c. They are listed here as follows:

TP2P1 = 450 Angstroms
TP3P1 = 450 Angstroms
TDP1 = 250 Angstroms
TBKP1 = 250 Angstroms For this embodiment the forward tunneling threshold voltage level VFX is about 7 volts, the reverse tunneling threshold level VRX is about 11 volts, and the threshold voltage VT required in order to invert the channel 34 of the transistor is 0.8 volts.

Table one lists the voltages on the drain 28a, source 28b, the read word line 14 and the program/erase word line 15 for programming a selected cell to store the first binary state (floating gate charged) and the same voltage levels for all unselected cells not be programmed by electron tunneling, or have a parasitic drain source IDS current that might cause hot-electrons programming from a silicon substrate.

TABLE (1)

|  | VD | VS | VP2 | VP3 | IDS |
|---|---|---|---|---|---|
| Selected Even Numbered Row | 14 | 7 | 0 | 14 | 0 |
| Unselected On Same Row | 7 | 7 | 0 | 14 | 0 |
| Unselected On Same Column Odd Numbered Row | 7 | 14 | 7 | 3 | 0 |
| Unselected On Same Column Even Numbered Row | 14 | 7 | 7 | 3 | 0 |

The programming of the selected cell will now be described with reference to Table (1) and FIG. 14. The drain voltage, VD, is coupled to the floating gate 18 by CDP1 and CP3P1. Once the voltage on the floating gate 30 rises to about 1 volt which is higher than the VT of cell, the drain area DA (34a) of the channel is inverted and acts as an additional capacitor plate to couple the drain voltage VD to P1. This capacitor is actually CBKP1 in FIG. 14. The source area SA (34b) of the channel is not depleted due to the fact that read word line 14 is held at 0 volts. The coupling via CBKP1 brings the potential of P1 to above 1 volt and is sufficient to deplete and invert the drain area DA (34a) of the channel of 34.

Accordingly, the voltage levels VD and VB and VP3 in equation (1) are equal to 14 volts. Substitution of these values into equation 1 with QP1 = 0 (floating gate not charged) and VP2 = 0 (word line at ground) indicates that the magnitude of VP1 is greater than 11 volts VRX. Because P2 is grounded, this voltage on P1 is applied across the electrodes of CP2P1 and exceeds the reverse threshold voltage of the oxide layer, so electrons tunnel from P2 to P1.

For unselected cells in the same row, VD is 7 volts, VP3 is 14 volts, so VP1 is about 5 volts, which is the voltage difference between P1 and P2. This voltage difference is insufficient to cause reverse tunnelling. For unselected cells in the same column, the potential of the read work lines 14 is at 7 volts, thus the potential difference between the floating gates 30 to the control gates 14 is about 3 volts, which is below the reverse tunneling threshold. Thus these cells will not program undesirably due to tunnelling of electrons. In addition VGS of the cell is 0 volts, because VP2 is 0 volts and SA is not depleted, so that no IDS exists. Thus accidental hot electron programming will not occur. Accordingly, the present system provides for programming a single cell. Very little, current is drawn because the floating gate is charged by the tunnelling mechanism.

Table (2) lists the voltages on the drain 28a, source 28b, the read word line 14 and the program/erase word line 15 for erasing (discharging) a selected cell to erase the first binary state (floating gate charged) and the value of these voltage levels for all unselected cells. It is critical that unselected cells along unselected word lines not be erased.

TABLE (2)

|  | VD | VS | VP2 | VP3 |
|---|---|---|---|---|
| Selected Even Numbered Row | 0 | 0 | 12 | 3 |
| Unselected On Same Row | 0 | 0 | 12 | 3 |
| Unselected On Same Column Odd Numbered Row | 0 | 0 | 0 | 3 |
| Unselected On Same Column Even Numbered Row | 0 | 0 | 0 | 3 |

For the selected cell to be erased, VD is at ground and VP2 is 12 volts. In this case, equation 1 indicates that the potential difference across CP2P1 is greater than the forward tunnelling voltage so electrons tunnel from the floating gate to the word line to erase (discharge) the floating gate. All unselected cells in the same row are also erased. Thus prior to beginning of the erase procedure the data of the unselected cells along the selected row is read into a register and the data is reprogrammed back into the unselected cells after the selected cell is erased.

VP2 of unselected rows is 0 volts. In this case equation 1 indicates that the potential difference CP2P1 is not sufficient to cause forward tunnelling across the oxide layer. Accordingly, a single cell in column may be erased.

The read operation of the cell is performed by raising the selected read word line 14 to 5 volts and holding all unselected word lines at 0 volts. The drain bit line 28a of the selected cell is held at 2.5 volts and the source bit-line 28b is held at about 0 volts. A decoder for the column bit-lines at one edge of the array selects the source bit-line 28b to the ground 0 voltage, and at the same time the decoder selects the drain bit line 28a to connect to an input of a sense amplifier. The sense amplifier detects the binary state of the memory cell. If the cell was programmed it will have a high threshold, thus the drain bit line voltage will remain at about 2.5 volts. If however the cell was not programmed the threshold will be about 0.8 volts, which will cause the bit line to be discharged toward the ground voltage (0 volts) of the source bit line. The sense amplifier detects these voltage levels, which represent two opposite logic level.

The third and fourth embodiments will now be described in reference to FIG. 1 and FIGS. 15a and 15b.

Detailed description of the electrical operation of the cell used in these embodiments is disclosed in U.S. Pat. No. 4,763,299 issued to Emanuel Hazani.

The cell programs when a high voltage VPP of 12 volts is applied to the read word line 14 of FIG. 1 (polysilicon 33z of FIG. 15b), a high voltage of about 8 volts is applied to the drain diffusion 28a, 0 volt is applied to the source diffusion 28b and voltage between 0 volt and 10 volts may be applied to the program/erase word line 60. These voltages are capacitively coupled to the floating gate 30 and its voltage increases to about 6 volts, which attract the hot electrons from the substrate induced by the high drain to source voltage of 8 volts.

Details about the asymmetry associated with the cell's programming operation and the reason that adjacent cells on the same row do not program, are detailed in the '299 patent.

During read operation of the selected cell the drain voltage is held relatively low at about 1 volt in order to prevent "soft write", which is an undesired acceleration of hot electrons that by accumulating with time on the floating gate 30 may change the cell's threshold voltage and so change a predetermined binary state of the cell. The source voltage is held at about 0 volts and the read word line 14 is at 5 volts. The program/erase word line 15 is held at about 3 volts in order to prevent a potential difference of more than 3.2 electron-volts (3.2 eV is the band gap energy of the polysilicon to silicon dioxide interface) to the floating gate 30, thus cause charge loss to this word line, which is lightly coupled to the floating gate 30 at about 10 percent capacitive ratio. In contrast, the read word line 14 is heavily coupled to the floating gate at about 85 percent capacitive ratio, thus will always pull the floating gate 30 closer to its voltage, which guarantees less than 3.2 eV potential difference across the oxide dielectric.

In order to provide conditions for increased hot electrons production in the channel, which will ease the programming operation of the third and fourth embodiments, a processing step of forming the n+ bit lines 28 is modified. The goal is to form a more abrupt n+ diffusion junction for the drain. This is accomplished by implanting a heavier arsenic ions dose of 6E16/cm2, at a higher energy of 80 KeV and annealing for a longer period of 15 minutes.

Figure 15A:
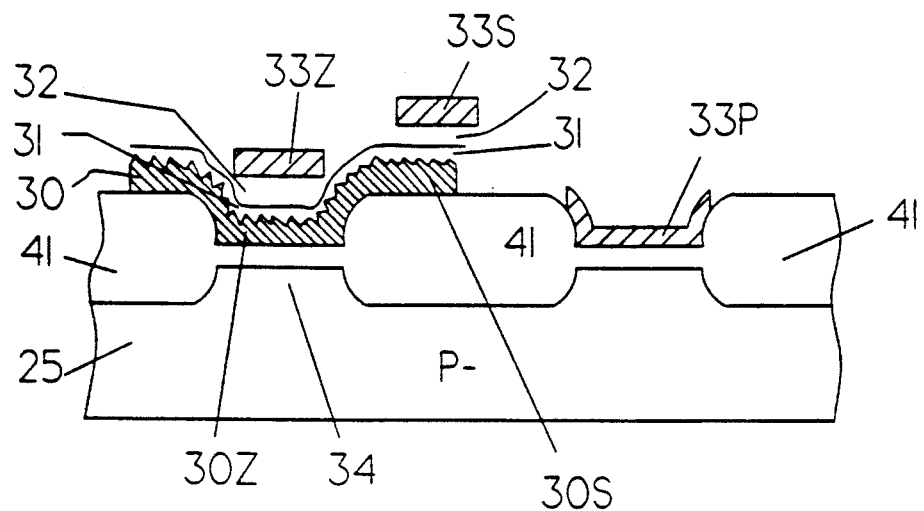
FIG. 15a and 15b illustrate schematic views of section cut along lines 3—3' of FIG. 1 as applicable to the fourth embodiment of the invention, which uses hot electrons to program.

FIG. 15a is a section cut along line 3—3' of FIG. 1 as it relates to the third embodiment of the present invention. FIG. 15a is also similar to FIG. 12 of the first embodiment, except the nitride dielectric layer 50 is not used in this third embodiment.

Figure 15B:
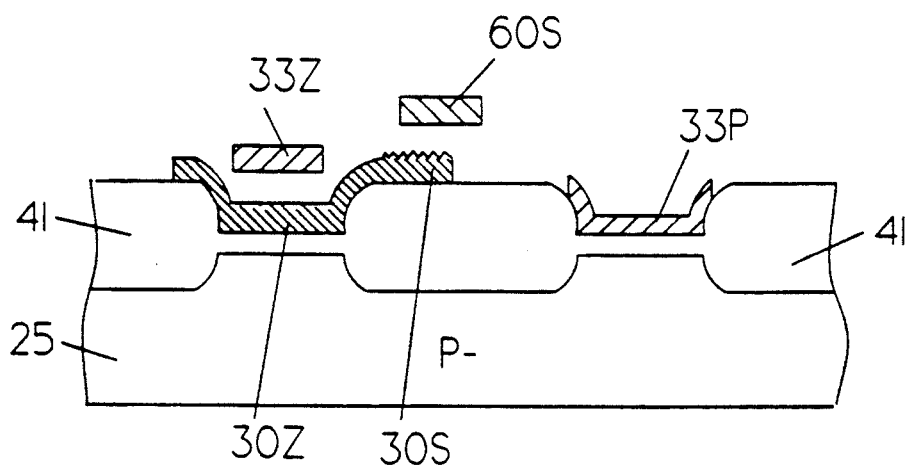

FIG. 15B is a section cut along line 3—3' of FIG. 1 as it relates to the fourth embodiment of the present invention. FIG. 15b is also similar to FIG. 13c of the second embodiment, except the asperities, bumps and rough edges are retained only on region 30s of the floating gate 30.

The process modifications to fabricate this fourth embodiment include the change in n+ diffusion implant process step similar to the third embodiment. Also after oxidizing the floating gate polysilicon 30, the program/erase word line 15 (polysilicon 60s of FIG. 15b) is deposited first in order to protect as an umbrella shield the region 30s of floating gate polysilicon 30 while a future heavy implant destroys the asperities, bumps and rough edges over the region 30z of floating gate 30.

After deposition of polysilicon 60s, oxide layers 31 and 32 are etched away from areas not covered by polysilicon 60s. A heavy implant similar to the one used for the second embodiment of FIG. 13c destroys the asperities, bumps and rough edges over region 30z of polysilicon floating gate 30. Hereinafter oxide layers 31 and 32 are regrown and polysilicon layer 33z of FIG. 15b is deposited to form the read word line 14 of FIG. 1.

The fifth embodiment of the invention will now be described in reference to FIGS. 16a to 21. In this embodiment the floating gate 30 covers the whole channel area 34, such that no split-gate device is created.

The processing steps that are required to fabricate this embodiment are similar up to and including the implant of the n+ diffusion 28 and the chemical stripping of the nitride 35, which result in FIG. 7a.

Figure 16A:
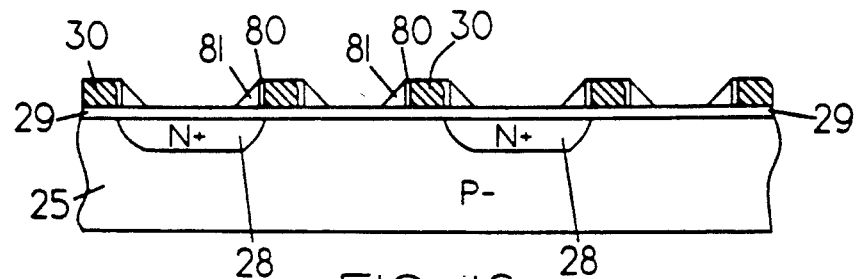
FIGS. 16a and 16b illustrate a cross section and top view, which result after a stage in the processing of the fifth embodiment of the invention, which does not have a split gate structure. This stage of processing come after the stage of FIGS. 7a and 7b of the first embodiment, but relates to the fifth embodiment.

Referring now to FIG. 16a, an oxide spacer is created in both sides of the polysilicon 30. The oxide spacer is created by thermally growing oxide layer 80 at 850 degrees Celsius to a thickness of 150 Angstroms and performing anisotropic etching so that oxide layer is retained only on the sidewalls of polysilicon 30. Thereafter a layer of TEOS based LPCVD oxide layer 81 is deposited to a thickness of 0.3 micrometers and anisotropic etching is performed to complete the oxide spacer as shown in FIG. 16a.

In order to create the asymmetry in hot electrons programming of this embodiment, an n− implant into the substrate of arsenic with a dose of about 3E13cm-2 is performed at about 40 KeV.

Figure 16B:
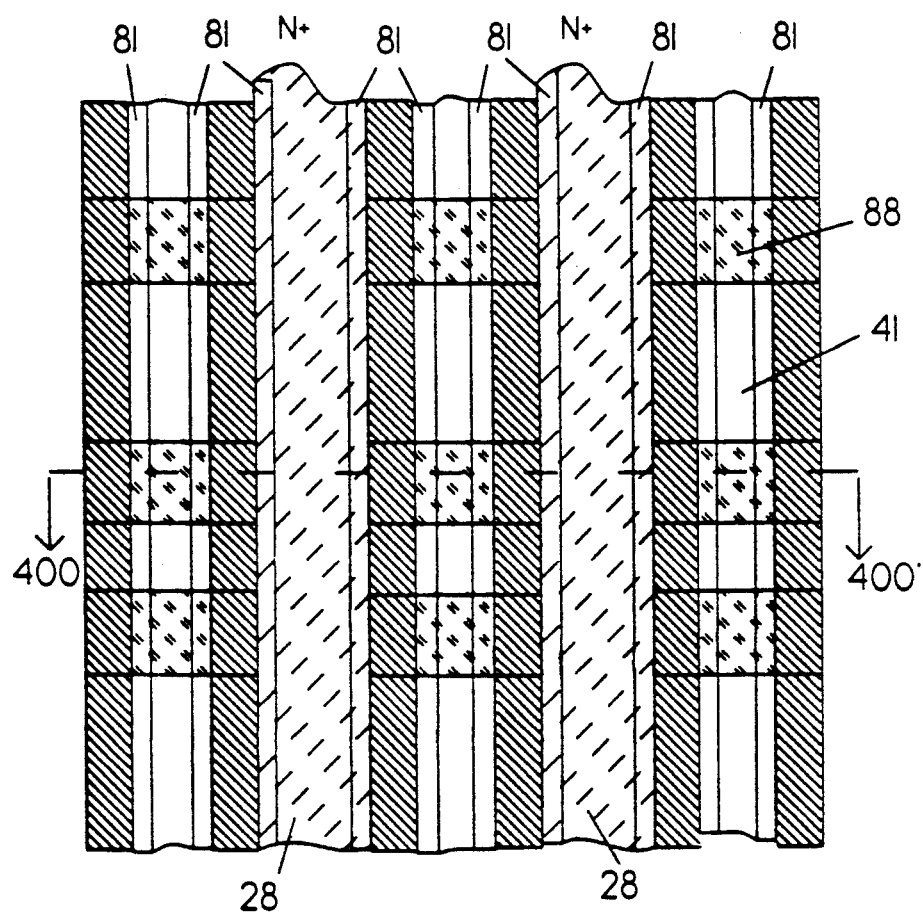
Figure 16C:
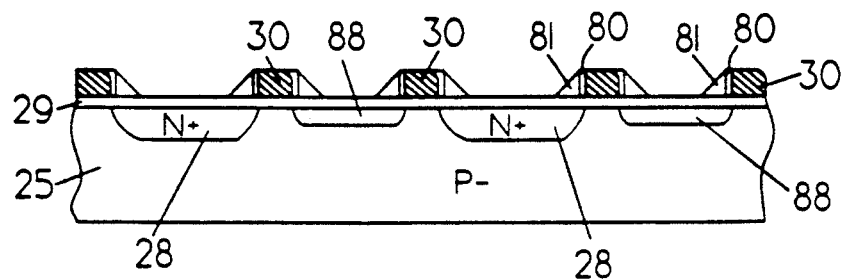

FIG. 16b is a top view of the memory array at this stage of the fabrication process. FIG. 16c is a cross section cut along line 400—400' of FIG. 16b in which N− layer 88 is shown. N− layer 88 will serve as part of the source diffusion for the memory cell as will be shown in reference to FIG. 17.

After etching of polysilicon 30 in similar steps that were described in references to FIGS. 8a, 8b and FIG. 9, another n+ arsenic implant is performed to form layer 89, which connects n+ diffusion layer 28 to n− layer 88 and forms the source of the memory cell transistor.

Figure 17:
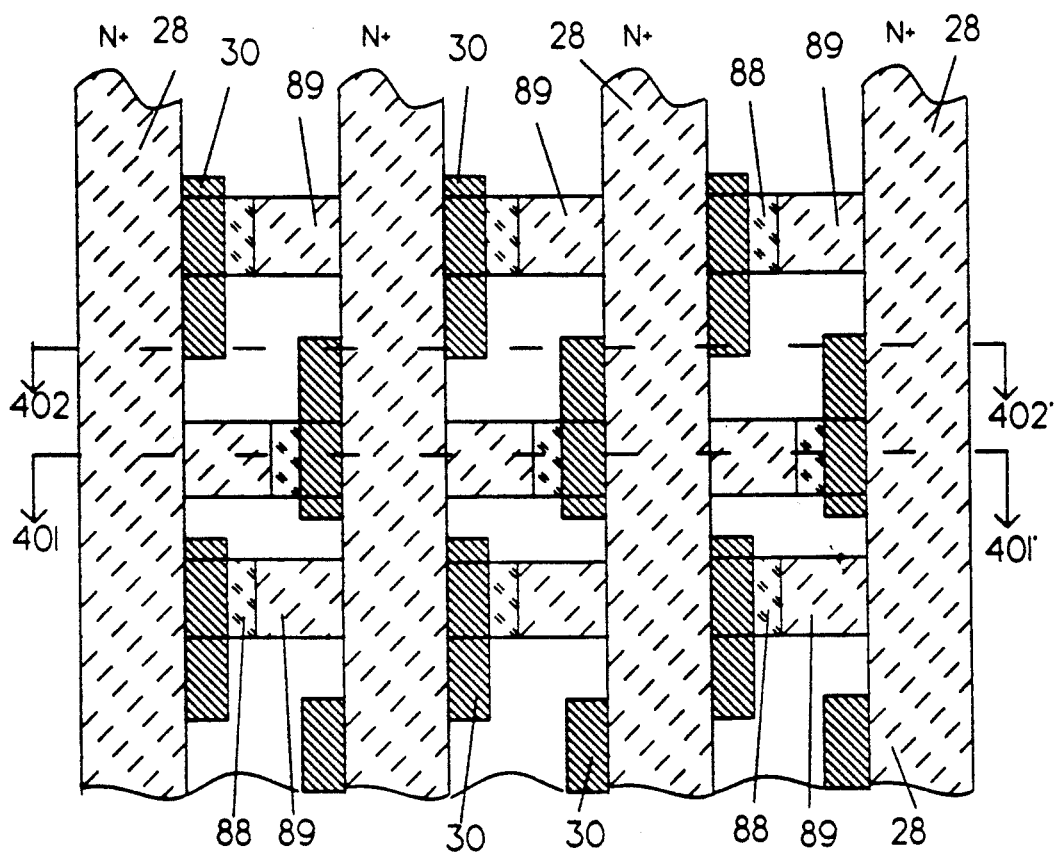
FIG. 17 illustrates the implant of the N+ into the substrate for the second time in order to connect the existing N+ bit-line implant and the N— asymmetry-implant of the fifth embodiment.

FIG. 17 illustrates a top view of the array at this stage of the fabrication process.

Figure 18A:
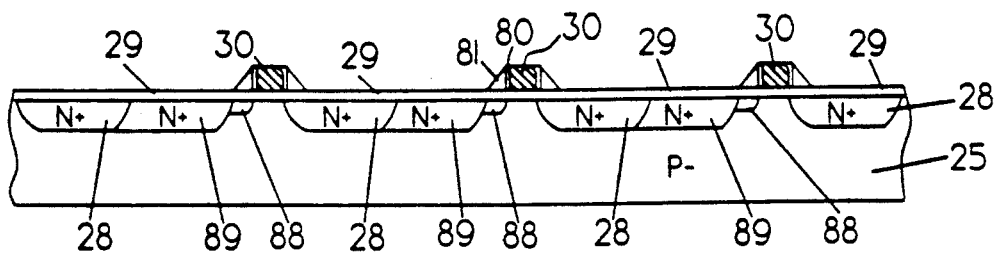
FIGS. 18a and 18b are section-cuts along lines 401—401' and 402—402' of FIG. 17 respectively.
Figure 18B:
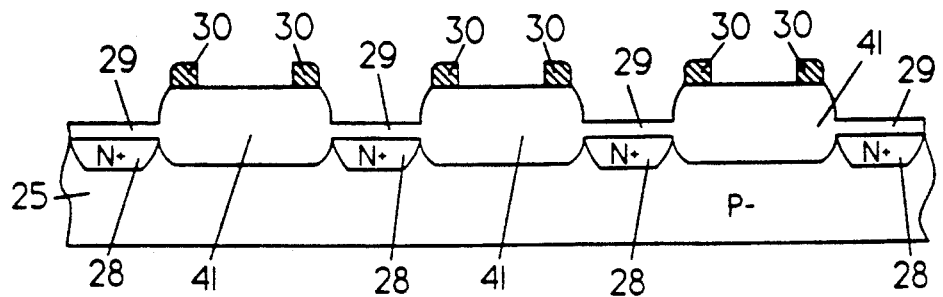

FIGS. 18a and 18b are cross sectional cuts along lines 401—401' and 402—402' of FIG. 17 respectively illustrating a profile of the various layers.

The process steps that follow, such as the oxidation of the floating gate polysilicon 30, the formation of the interpolysilicon dielectric and the formation of the word lines are similar to those that were used in the previous embodiments, so that several other non-split gate versions (embodiments) may be created, which are analogous to the first, second, third and fourth embodiments.

Figure 19:
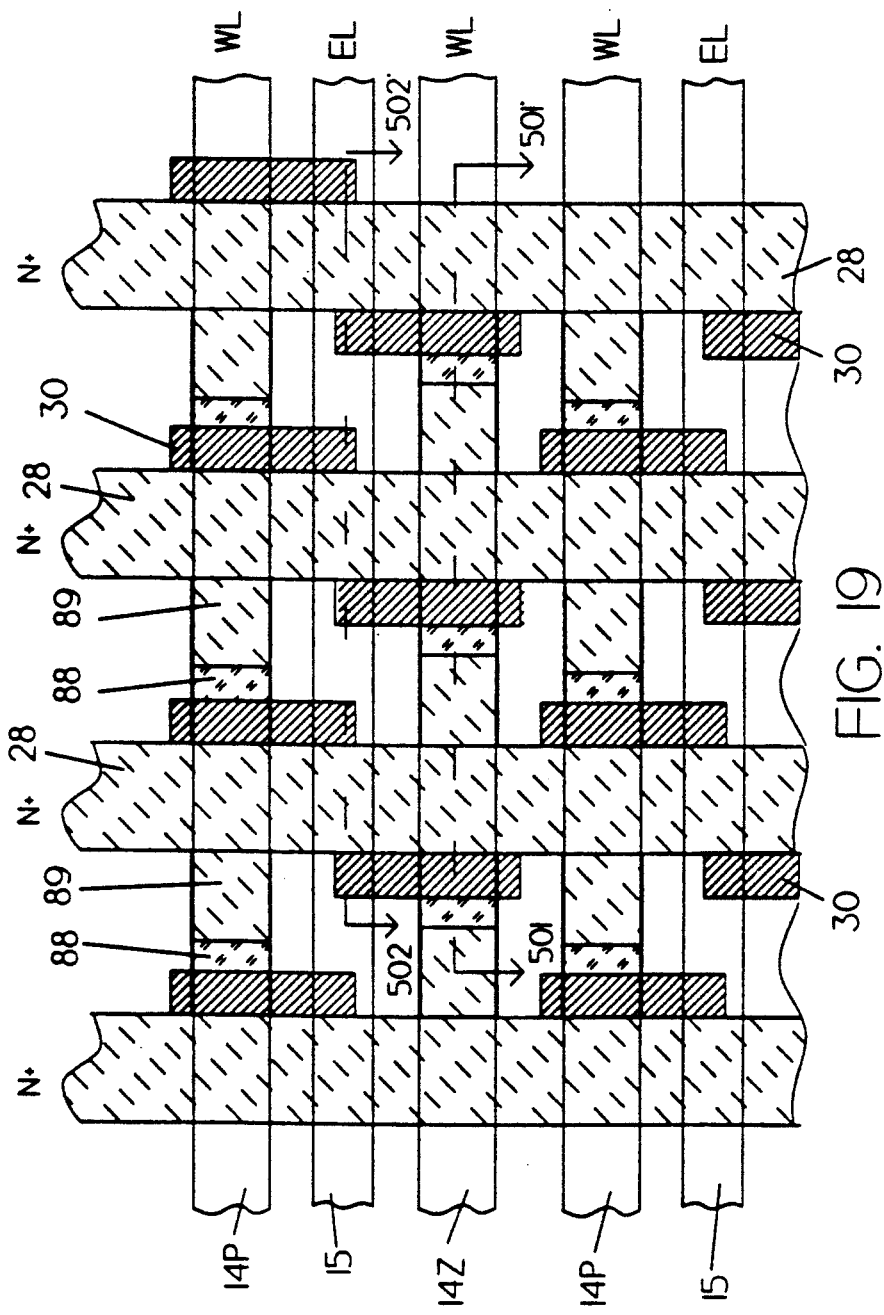
FIG. 19 is a plan view of a portion of a memory chip containing an array of the fifth embodiment of the present invention.
Figure 20:
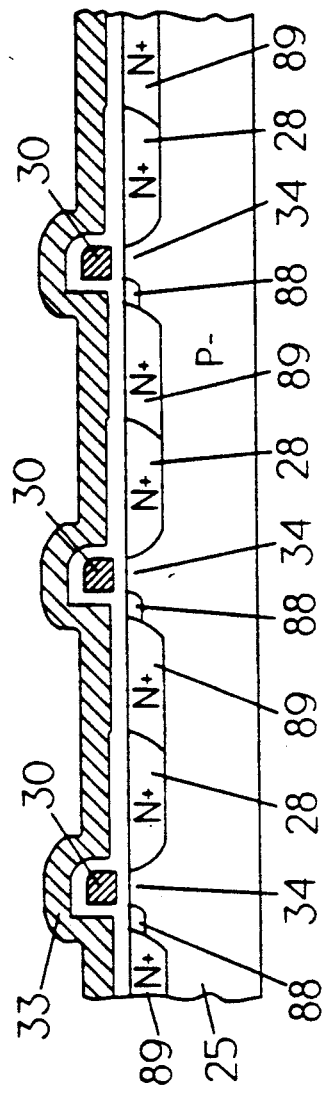
FIG. 20 is a cross section view of the memory cells of FIG. 19 along the channel regions, line 501—501' of FIG. 19.

FIGS. 19 is a top view of the array of this fifth embodiment after the formation of the word lines. FIG. 20 is a cross sectional cut along line 501—501' of FIG. 19 illustrating a cut along the read word line 14z.

Figure 21:
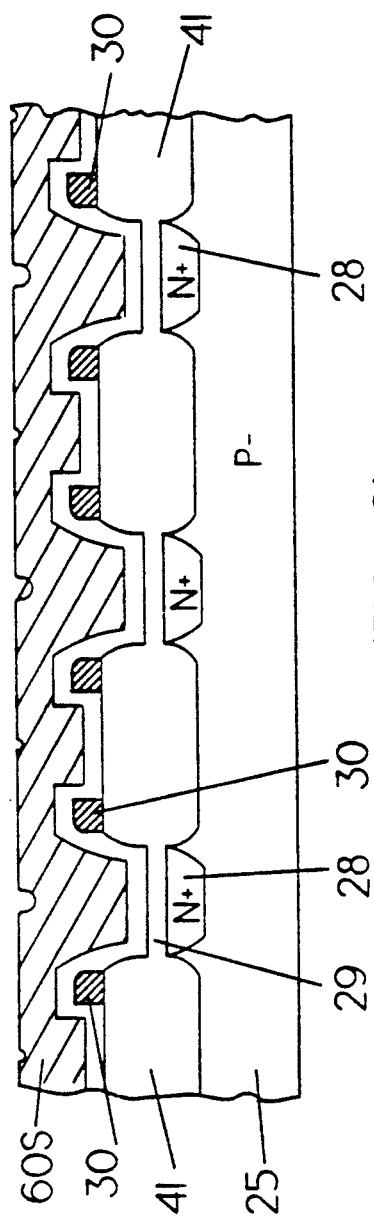
FIG. 21 is a cross section view of the memory cells of FIG. 19 along the isolation regions, line 502—502' of FIG. 19.

FIG. 21 is a cross sectional cut along line 502—502' of FIG. 19 illustrating a cut along the program/erase word line 15.

The electrical operation of two versions of this fifth embodiment will now be described.

The first version of the fifth embodiment is analogous in its operation to the operation of the first and second embodiments for which section cuts are shown in FIG. 12 and FIG. 13c respectively. Programming operation is accomplished by electron tunneling from the read word line 14 to the floating gate 30, and erase is performed by electron tunneling from the floating gate 30 to the read word line 14.

Since in the fifth embodiment the floating gate covers all the channel 34, the drain voltage is held at 0 volts to prevent parasitic hot electrons programming from the substrate, when the program/erase word line 15 is taken to a high voltage that couples to the floating gate 30 and increases its potential. Erasure is performed as with the first embodiment by taking the read word line 14 to a high voltage and holding all other terminals of the cell at 0 volts.

The second version of the fifth embodiment is analogous in its operation to the operation of the third and fourth embodiments for which section cuts are shown in FIG. 15a and FIG. 15b respectively. The programming and erasure is performed with hot electrons and tunneling respectively, as was described in reference to the third and fourth embodiments.

When programming a cell of the second version of the fifth embodiment in an array, a source voltage biasing is required at about 1 volt. This is done in order to minimize a parasitic drain to source current that is introduced by unselected cells along the same bit line, but under different word lines. This phenomenon is called "drain turn-on" and is introduced by coupling of the drain 28's voltage to the floating gate 30 to a point where the channel 34 is depleted and current starts to flow between drain and source. This phenomenon is well known in the art, and does not exist in the split gate embodiments, such as the third and fourth since the floating gate 30 inverts only the drain area 34a, where the source are 34b is "off" because it is covered by the read word line polysilicon 33, which is held at 0 volts for the unselected cells.

Figure 22:
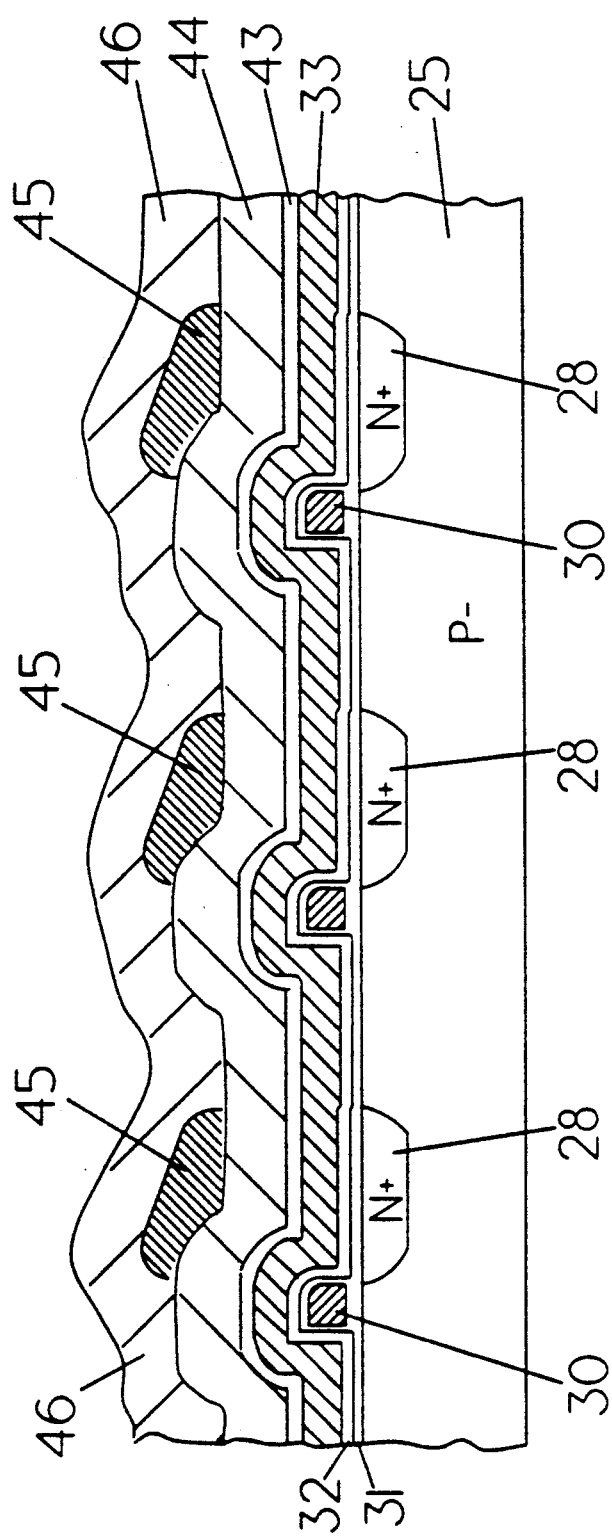
FIG. 22 is a cross section along line 501—501' of FIG. 1 illustrating a later fabrication stage which includes the metal bit-lines.

FIG. 22 illustrates a sectional view similar to that shown in FIG. 2 after the addition of subsequent layers. An LPCVD TEOS based pad oxide layer 43 is deposited and is covered with a layer 44 of phosphorous-doped field oxide. Metal layers 45, for example of aluminum are then formed and patterned to form the column bit-lines. Each metal bit-line connects to a separate n+ bit-line 28 every several word-lines, through a contact opening in the field oxide. This is done in order to shunt the n+ higher resistance in order to prevent an undesired voltage drop between a selected cell and ground or the path between the selected cell and the sense-amplifier.

The metal lines of layer 45 are then covered with protective oxide coating 46 formed of 4% phosphorous-doped silicon dioxide.

When the fabrication process disclosed herein is used to fabricate a split-gate EPROM, the memory cell becomes even smaller since the program/erase word line 15 (FIG. 1) is not used. This allows bringing the read word lines 14 closer, which reduces the memory cell size. As known the EPROM cell will program when the control gate 33 is at high voltage Vpp, the drain voltage is at high voltage close to Vpp and the source voltage is at Vss ground voltage. This bias condition causes high current flow between drain and source diffusions, which in turn causes electron injection from the substrate into the floating gate through oxide layer 29a. These increase in number of electrons trapped in the floating gate increases the threshold of the cell significantly, thus it is programmed.

Preferred embodiments of the invention have now been described. Various substitutions and alterations to these embodiments will be apparent to persons of skill in the art apprised by the teaching of this patent. It is therefore not intended that the invention be limited to the described embodiments, but that invention be defined by the appended claims.

What is claimed is:

1. A process for fabricating a floating gate memory array in a semiconductor memory device having a substrate of a first conductivity type that has a major surface comprising the steps of:

forming continuous, elongated, spaced apart, parallel first strips over first regions of said substrate and in a first direction, said first strips comprising a first thin dielectric layer having a first thickness disposed on said substrate, a first conductive layer disposed on said first thin dielectric and a second dielectric layer disposed on said conductive layer, said first strips defining elongated, parallel, spaced-apart second regions of said substrate between said first strips;

forming first impurity regions of a second conductivity type at said second regions of said substrate between said first strips to be self-aligned with said first strips;

treating the resulting structure to diffuse said impurities into said second substrate regions and into a portion of said first substrate regions so that at least one of said first impurity regions along each of said associated one of said first strips forms plurality of spaced-apart second conductivity type substrate regions under and along a portion of the width of said associated first strip;

growing an oxide at said second regions of said substrate to a second thickness while substantially retaining the thickness of said first thin dielectric disposed between said second conductivity type diffusion regions in said first substrate regions and said first conducive layer;

removing said second dielectric from said first strips to form second strips over said first regions of said substrate comprising said first thin dielectric and said first conductive layer;

forming a plurality of first gate members from each of said second strips; and forming elongated second gate members from a second conductive layer, said second gate members being formed over said first gate members, said second gate members being generally parallel to a second direction that is perpendicular to said first direction of said first and second regions along said major surface of said substrate.

2. The process as defined in claim 1 wherein said first conductive strips are made of polycrystalline silicon.

3. The process as defined in claim 1 wherein said first thin dielectric is comprised of silicon dioxide.

4. The process as defined in claim 1 wherein the formation of said first strips is performed after the formation of isolation regions on said substrate at locations that are adjacent and continuous with the locations of said second regions.

5. The process as defined in claim 1 wherein said first thin dielectric layer is capable of exhibiting electric charge transport between said first conductive gate members and said substrate.

6. The process as defined in claim 1 wherein said impurities at said second regions are formed by implanting ions.

7. The process as defined in claim 1 wherein said first impurities regions form diffused conductive regions at said second substrate regions to conductively connect associated plurality of said second conductivity type diffusion regions in said first substrate regions.

8. The process as defined in claim 1 wherein alternate ones of said second regions are doped with an n-type dopant to a first level of doping and the other of said second regions are doped with an n-type dopant to a second level of doping, said first level of doping being different from said second level of doping.

9. The process as defined in claim 1 wherein alternate ones of said second regions are doped with an n-type dopant to a first depth of doping and the other of said second regions are doped with an n-type dopant to a second depth of doping, said first depth of doping being different from said second depth of doping.

10. The process as defined in claim 1 wherein alternate ones of said second regions are doped with an n-type dopant to a first level of doping and the other of said second regions are doped with an n-type dopant to a second level of doping, said first level of doping being higher than said second level of doping and wherein said second regions with higher level of doping form drains of programmable field-effect transistors (FETs) and said second regions with lower levels of doping form sources of said programmable FETs.

11. The process as defined in claim 1 wherein alternate ones of said second regions are doped with an n-type dopant to a first depth of doping and the other of said second regions are doped with an n-type dopant to a second depth of doping, said first depth of doping being deeper than said second depth of doping and wherein said second regions with deeper depth of doping form drains of programmable field-effect transistors (FETs) and said second regions with shallower depths of doping form sources of said programmable FETs.

12. The process as defined in claim 1 wherein the thickness of said floating gates is more than 3000 Angstroms.

13. The process as defined in claim 1 wherein the thickness of each said first gate members is more than one third of the width of said first regions of the substrate.

14. The process as defined in claim 1 wherein said growth of said oxide at said second regions is performed after forming said first impurities regions of said second type.

15. The process as defined in claim 1 wherein one of said second regions is doped with an n-type dopant to a first depth of doping and the other of said second regions is doped with an n-type dopant to a second depth of doping, said first depth of doping being different from said second depth of doping, and said monocrystalline silicon substrate is p-type doped.

16. The process as defined in claim 1 further comprising the step of forming at least one spacer along each of said first conductive strips before the formation of said second gate members, and permanently retaining said spacer under each of said second gate members with a thin insulator there between; and wherein each of said spacers having of a first spacer portion made of a thermally grown oxide that is in contact with said associated first gate member and a second spacer portion that is made of material other than a thermally grown oxide.

17. A process for fabricating a programmable non-volatile memory array in a semiconductor memory device having a substrate of a first conductivity type that has a major surface comprising the steps of:

forming continuous, elongated, spaced apart, parallel first strips over first regions of said substrate and in a first direction, said first strips comprising a first thin dielectric layer having a first thickness disposed on said substrate, a first layer capable capable of storing electric charge changes thereby controlling the current conduction through a channel of a field-effect transistor, said first layer is disposed on said first thin dielectric and a second dielectric layer disposed on said first layer that stores electric charge changes, said first strips defining elongated, parallel, spaced-apart second regions of said substrate between said first strips;

forming first impurity regions of a second conductivity type at said second regions of said substrate between said first strips to be self-aligned with said first strips;

treating the resulting structure to diffuse said impurities into said second substrate regions and into a portion of said first substrate regions so that, at least one of said first impurity regions along each of said associated one of said first strips forms plurality of spaced-apart second conductivity type substrate regions under and along a portion of the width of said associated first strip;

growing an oxide at said second regions of said substrate to a second thickness while substantially retaining the thickness of said first thin dielectric disposed between said second conductivity type diffusion regions in said first substrate regions and said first layer;

removing said second dielectric from said first strips to form second strips over said first regions of said substrate comprising said first thin dielectric and said first layer;

forming a plurality of first gate members from each of said second strips; and forming elongated second gate members from a conductive layer, said second gate members being formed over said first members, said second gate members being generally parallel to a second direction that is perpendicular to said first direction of said first and second substrate regions along said major surface of said substrate.

18. The method of claim 17, further including the step of texturing the surface of said first polysilicon layer.

19. A process for fabricating a field-effect semiconductor memory device comprising the steps of:

supplying a monocrystalline silicon substrate of a first conductivity type;

forming a first member over a first region of said substrate, said first member comprising a gate oxide layer disposed on said substrate, a first polysilicon layer disposed on said gate oxide and a second dielectric layer disposed on said first polysilicon layer;

forming first impurity regions of a second conductivity type at predetermined second regions of said substrate along said first polysilicon thereby forming a source and a drain, and at least one of said first impurity regions forms an second conductivity type diffusion regions in said first substrate region under said member;

growing an oxide at said predetermined second regions of said substrate to a second thickness while substantially retaining the thickness of said gate oxide disposed between said second conductivity type diffusion regions in said first substrate regions and said first polysilicon layer;

removing said second dielectric from said first member; and forming a textured surface with asperities on said first polysilicon layer.

20. The process as defined in claim 19 further comprising the step of:

forming a second polysilicon layer over said first polysilicon layer in a manner to be insulated therefrom by a third dielectric layer, thereby said first polysilicon layer and said second polysilicon layer forming a floating gate and a control gate respectively of a programmable non-volatile device.

21. The process as defined in claim 19 wherein one of said second regions is doped with an n-type dopant to a first level of doping and the other of said second regions is doped with an n-type dopant to a second level of doping, said first level of doping being different from said second level of doping, and said monocrystalline silicon substrate is p-type doped.

22. The process as defined in one of claims 19 wherein said growth of said oxide at said predetermined second regions of said substrate is carried out at a temperature of less than 875° C. in a wet oxidation process.

23. A process for fabricating a programmable non-volatile memory array in a semiconductor memory device having a substrate of a first conductivity type that has a major surface comprising the steps of:

forming a first plurality of continuous elongated parallel and spaced apart strips of conductive material to be insulatively disposed over said substrate and in a first direction, wherein a first dielectric layer is formed between said first plurality of conductive strips and the substrate;

forming a spacer along at least one side of each of said first parallel conductive strips, each spacer being insulatively disposed over said substrate and only along said conductive strips, wherein said spacer comprising a first spacer portion made of a thermally grown oxide that is in contact with said conductive parallel strip and a second spacer portion that is made of material other than a thermally grown oxide;

forming gaps in said first parallel conductive strips thereby forming plurality of electrically insulated floating gates from at least one of said first strips; and forming a second plurality of continuous elongated strips from a second conductive layer, said second strips being disposed over a thin insulator that is disposed over said floating gates and said spacers, said second strips being generally parallel to a second direction that is perpendicular to said first direction of said first strips and said second strips forming control gates and word lines of said memory array along said major surface of said substrate.

24. The process of claim 23 wherein said spacers are made of insulating material having a dielectric constant.

25. The process of claim 23 wherein said substrate is of a first conductivity type and wherein prior to forming said spacer, impurities regions of a second conductivity type are formed in said substrate so that said impurities are adjacent and self aligned to associated ones of said first parallel conductive strips, said impurities regions forming source and drain regions of MOS memory transistors and also forming bit line regions to conductively connect memory cells of said array.

26. The process of claim 25 wherein:

said floating gates partially overlap associated first regions of said associated impurities region of said substrate by a diffusion determined distance and portion of said first dielectric layer is disposed there between;

said second strips of conductive material are formed over said floating gates, over said spacers and over said impurities regions in a manner to be insulated therefrom by a second dielectric layer; wherein the thickness of said second dielectric over said impurities regions is formed by thermally growing said second dielectric layer while substantially maintaining the thickness of said first dielectric in said first regions of said impurities regions.

27. The process of claim 25 wherein said floating gates partially overlap said associated impurities region by a diffusion determined distance.

28. The process of claim 23 further including the step of changing the thickness of said floating gates.

29. The process of claim 25 wherein said floating gate overlaps said drain region more than said floating gate overlaps said source region.

30. The process as defined in one of claims 2, or 17 or 19 or 20 or 18 or 3 or 4 or 5 or 6 or 7 or 8 or 9 or 10 or 11 or 12 or 13 or 21 or 15 or 22 or 29 wherein said growth of said oxide at said second regions is performed after forming said first impurities regions of said second type.

31. The process as defined in one of claims 1 or 2 or 17 or 19 or 20 or 18 or 3 or 4 or 5 or 6 or 7 or 8 or 9 or 10 or 11 or 12 or 13 or 14 or 21 or 15 or 22 or 29 wherein said growth of said oxide at said second regions is carried out at a temperature of less than 875° C. in a wet oxidation process.

32. The process as defined in one of claims 1 or 2 or 17 or 19 or 20 or 18 or 3 or 4 or 5 or 6 or 7 or 8 or 9 or 10 or 11 or 12 or 13 or 14 or 21 or 15 or 22 or 29 wherein the thickness of said first dielectric layer is in the range of 90-260 angstroms.

33. The process as defined in one of claims 1 or 2 or 17 or 20 or 18 or 3 or 4 or 5 or 6 or 7 or 8 or 9 or 10 or 11 or 12 or 13 or 14 or 21 or 15 or 22 or 29 further comprising the step of: depositing TEOS based oxide over and to be in contact with said grown oxide at said second substrate regions, after growing said oxide at said second substrate regions and before forming said second conductive layers.

34. The process as defined in one of claims 1 or 2 or 17 or 19 or 20 or 18 or 3 or 4 or 5 or 6 or 7 or 8 or 9 or 10 or 11 or 12 or 13 or 14 or 21 or 15 or 22 or 29 further comprising the step of forming at least one spacer along each of said first conductive strips before the formation of said second gate members, and permanently retaining at least a portion of said spacer under each of said second gate members with a thin insulator there between, whereby said thin insulator is disposed over and in contact with said spacer and thin insulator is disposed under and in contact with said second gate member.

* * * * *